US012599037B2

(12) United States Patent
Kim et al.

(10) Patent No.: US 12,599,037 B2
(45) Date of Patent: Apr. 7, 2026

(54) SEMICONDUCTOR PACKAGE

(71) Applicant: SAMSUNG ELECTRONICS CO., LTD., Suwon-si (KR)

(72) Inventors: Song-Soo Kim, Asan-si (KR); Taeduk Nam, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 833 days.

(21) Appl. No.: 17/729,060

(22) Filed: Apr. 26, 2022

(65) Prior Publication Data

US 2023/0011160 A1     Jan. 12, 2023

(30) Foreign Application Priority Data

Jul. 7, 2021     (KR) ......................... 10-2021-0088913

(51) Int. Cl.
*H01L 25/065* (2023.01)
*H01L 23/00* (2006.01)

(52) U.S. Cl.
CPC ...... *H01L 25/0652* (2013.01); *H01L 25/0657* (2013.01); *H01L 24/16* (2013.01);
(Continued)

(58) Field of Classification Search
CPC . H01L 2224/16145; H01L 2224/16147; H01L 2224/16227; H01L 2224/16237; H01L 2224/3201; H01L 2224/32145; H01L 2224/32225; H01L 2224/3303; H01L 2224/45099; H01L 2224/48145; H01L 2224/48148; H01L 2224/48227; H01L 2224/48228; H01L 2224/49171; H01L 2224/73265; H01L 2224/8592; H01L 2224/97; H01L 2225/06506; H01L 2225/0651; H01L 2225/06513; H01L 2225/06517; H01L 2225/06524; H01L 2225/06541; H01L 2225/06562; H01L 24/16; H01L 24/32; H01L 24/33; H01L 24/48; H01L 24/49; H01L 24/73; H01L 24/85; H01L 24/97; H01L 25/0652; H01L 25/0657; H01L 25/18; H01L 2924/00012; H01L 2924/00014; H01L 2924/1011; H01L 2924/10158; H01L 2924/1431; H01L 2924/1434; H01L 2924/15192; H01L 2924/15311; H01L 2924/181
See application file for complete search history.

(56) References Cited

U.S. PATENT DOCUMENTS 5,600,541 A     2/1997     Bone et al.
6,274,930 B1     8/2001     Vaiyapuri et al.
(Continued)

FOREIGN PATENT DOCUMENTS

CN        112447613 A  *  3/2021  ............. H01L 23/13
JP        2005203776 A      7/2005
(Continued)

*Primary Examiner* — Telly D Green
(74) *Attorney, Agent, or Firm* — Muir Patent Law, PLLC

(57) ABSTRACT

A semiconductor package includes first semiconductor chips stacked on a package substrate, a lowermost first semiconductor chip of the first semiconductor chips including a recessed region, and a second semiconductor chip inserted in the recessed region, the second semiconductor chip being connected to the package substrate.

20 Claims, 22 Drawing Sheets

(52) U.S. Cl.
CPC .............. *H01L 24/32* (2013.01); *H01L 24/33*
(2013.01); *H01L 24/48* (2013.01); *H01L 24/73*
(2013.01); *H01L 2224/16147* (2013.01); *H01L*
*2224/16227* (2013.01); *H01L 2224/16237*
(2013.01); *H01L 2224/3201* (2013.01); *H01L*
*2224/32145* (2013.01); *H01L 2224/32225*
(2013.01); *H01L 2224/3303* (2013.01); *H01L*
*2224/48148* (2013.01); *H01L 2224/48228*
(2013.01); *H01L 2224/73265* (2013.01); *H01L*
*2225/06506* (2013.01); *H01L 2225/0651*
(2013.01); *H01L 2225/06513* (2013.01); *H01L*
*2225/06517* (2013.01); *H01L 2225/06524*
(2013.01); *H01L 2225/06541* (2013.01); *H01L*
*2225/06562* (2013.01); *H01L 2924/1011*
(2013.01); *H01L 2924/10158* (2013.01); *H01L*
*2924/1431* (2013.01); *H01L 2924/1434*
(2013.01)

(56)                  References Cited

U.S. PATENT DOCUMENTS

| | | | |
|---|---|---|---|
| 8,188,379 B2 | 5/2012 | Hsu et al. | |
| 9,293,422 B1 | 3/2016 | Parsa et al. | |
| 11,862,603 B2 * | 1/2024 | Kim .................... | H01L 25/0652 |
| 2003/0178710 A1 * | 9/2003 | Kang .................. | H01L 25/0657 257/673 |
| 2003/0207516 A1 * | 11/2003 | Tan ......................... | H01L 24/29 257/E29.022 |
| 2004/0050571 A1 * | 3/2004 | Lee .................... | H01L 25/0657 174/521 |
| 2004/0251526 A1 * | 12/2004 | Hur .................... | H01L 25/0657 257/E21.705 |
| 2005/0194673 A1 * | 9/2005 | Kwon .................... | H01L 24/49 257/E29.022 |
| 2012/0018895 A1 * | 1/2012 | Oganesian ........... | H10F 39/182 257/773 |
| 2012/0146177 A1 * | 6/2012 | Choi ...................... | H01L 24/97 257/528 |
| 2013/0157414 A1 | 6/2013 | Ho et al. | |
| 2014/0175673 A1 * | 6/2014 | Kim ....................... | H01L 24/06 257/777 |
| 2015/0061096 A1 * | 3/2015 | Goh ....................... | H01L 24/89 257/676 |
| 2015/0069624 A1 * | 3/2015 | Pham ................. | H01L 25/0652 438/109 |
| 2015/0200187 A1 * | 7/2015 | Park ....................... | H01L 24/49 257/777 |
| 2016/0064365 A1 * | 3/2016 | Jang .................... | H01L 25/0652 257/777 |
| 2017/0125378 A1 * | 5/2017 | Park ....................... | H01L 24/48 |
| 2019/0013301 A1 | 1/2019 | Cheah et al. | |
| 2019/0103409 A1 * | 4/2019 | Xu ...................... | H01L 25/0657 |
| 2019/0164948 A1 * | 5/2019 | Chang Chien ........ | H01L 21/486 |
| 2020/0118976 A1 * | 4/2020 | Ahn ....................... | H01L 21/56 |
| 2021/0066245 A1 * | 3/2021 | Ahn .................... | H01L 25/0657 |
| 2021/0074619 A1 | 3/2021 | Kurata | |
| 2021/0111152 A1 * | 4/2021 | Park .................... | H01L 23/5385 |
| 2021/0159213 A1 * | 5/2021 | Kim .................... | H01L 25/0655 |

FOREIGN PATENT DOCUMENTS

| | | |
|---|---|---|
| KR | 10-2015-0107348 A | 9/2015 |
| KR | 10-2016-0025945 A | 3/2016 |
| KR | 10-2017-0020663 A | 2/2017 |
| KR | 10-2021-0025949 A | 3/2021 |

* cited by examiner

SEMICONDUCTOR PACKAGE

CROSS-REFERENCE TO RELATED APPLICATION

This U.S. non-provisional patent application claims priority under 35 U.S.C. § 119 to Korean Patent Application No. 10-2021-0088913, filed on Jul. 7, 2021, in the Korean Intellectual Property Office, the entire contents of which are hereby incorporated by reference.

BACKGROUND

1. Field

The present disclosure relates to a semiconductor package.

2. Description of the Related Art

A semiconductor package is configured to easily use an integrated circuit chip as a part of an electronic product. Conventionally, the semiconductor package includes a printed circuit board (PCB) and a semiconductor chip die, which is mounted on the PCB and is electrically connected to the PCB using bonding wires or bumps. With development of the electronic industry, many studies are being conducted to improve reliability and durability of the semiconductor package.

SUMMARY

According to an embodiment, a semiconductor package may include first semiconductor chips stacked on a package substrate, wherein a lowermost first semiconductor chip of the first semiconductor chips includes a recessed region, and a second semiconductor chip is inserted in the recessed region and connected to the package substrate.

According to an embodiment, a semiconductor package may include a first semiconductor chip disposed on a center region of a package substrate and connected to the package substrate, the first semiconductor chip having a first side surface and a second side surface, which are opposite to each other, and second to fifth semiconductor chips overlapping the first side surface of the first semiconductor chip, sequentially stacked on the first semiconductor chip, and connected to the package substrate. The second semiconductor chip may include a first semiconductor substrate and a first circuit layer on the first semiconductor substrate. The first semiconductor substrate may be provided to define a first recessed region, in which the first semiconductor chip is inserted. The first recessed region may have a depth ranging from 90 μm to 780 μm, when measured from the lowermost portion of a bottom surface of the first semiconductor substrate.

According to an embodiment, a semiconductor package may include a first semiconductor chip disposed on and connected to a package substrate, a second semiconductor chip disposed on the first semiconductor chip, the second semiconductor chip having a recessed region, in which the first semiconductor chip is inserted, a wire connecting the second semiconductor chip to the package substrate, a third semiconductor chip on the second semiconductor chip, and a first adhesive layer between the second semiconductor chip and the third semiconductor chip. An upper portion of the wire may be buried in the first adhesive layer.

BRIEF DESCRIPTION OF THE DRAWINGS

Features will become apparent to those of skill in the art by describing in detail exemplary embodiments with reference to the attached drawings, in which:

FIG. 1 is a plan view of a semiconductor package according to an embodiment.

FIG. 2 is a cross-sectional view taken along a line A-A' of FIG. 1.

FIG. 6 is a cross-sectional view of a second semiconductor chip according to an embodiment.

FIG. 15 is a cross-sectional view of a semiconductor package according to an embodiment.

FIG. 18 is a plan view of a semiconductor package according to an embodiment.

DETAILED DESCRIPTION

Figure 3:
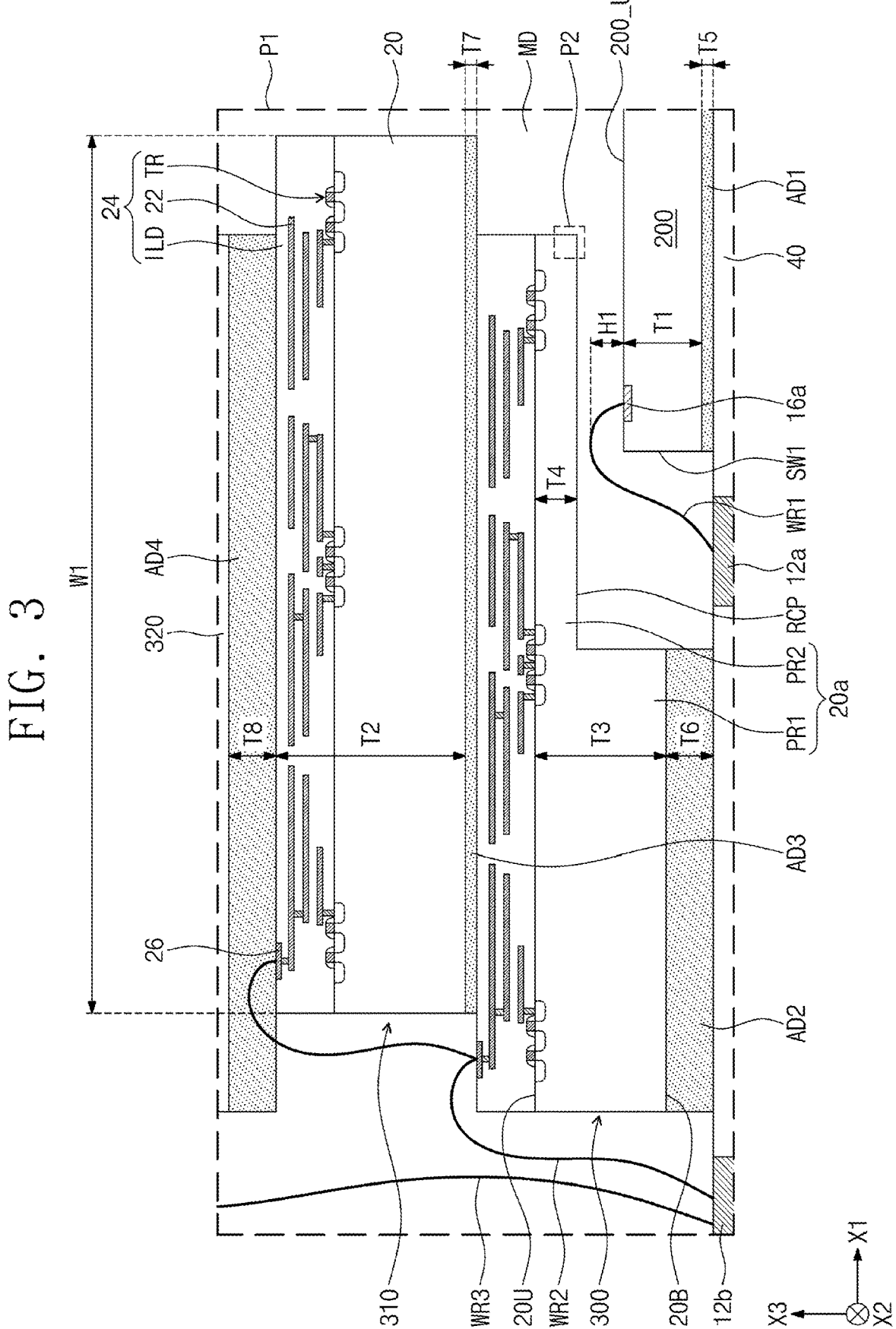
FIG. 3 is an enlarged cross-sectional view of portion 'P1' of FIG. 2.

Example embodiments will now be described more fully with reference to the accompanying drawings, in which example embodiments are shown. Like reference numerals in the drawings denote like elements, and thus their description will be omitted.

Figure 1:
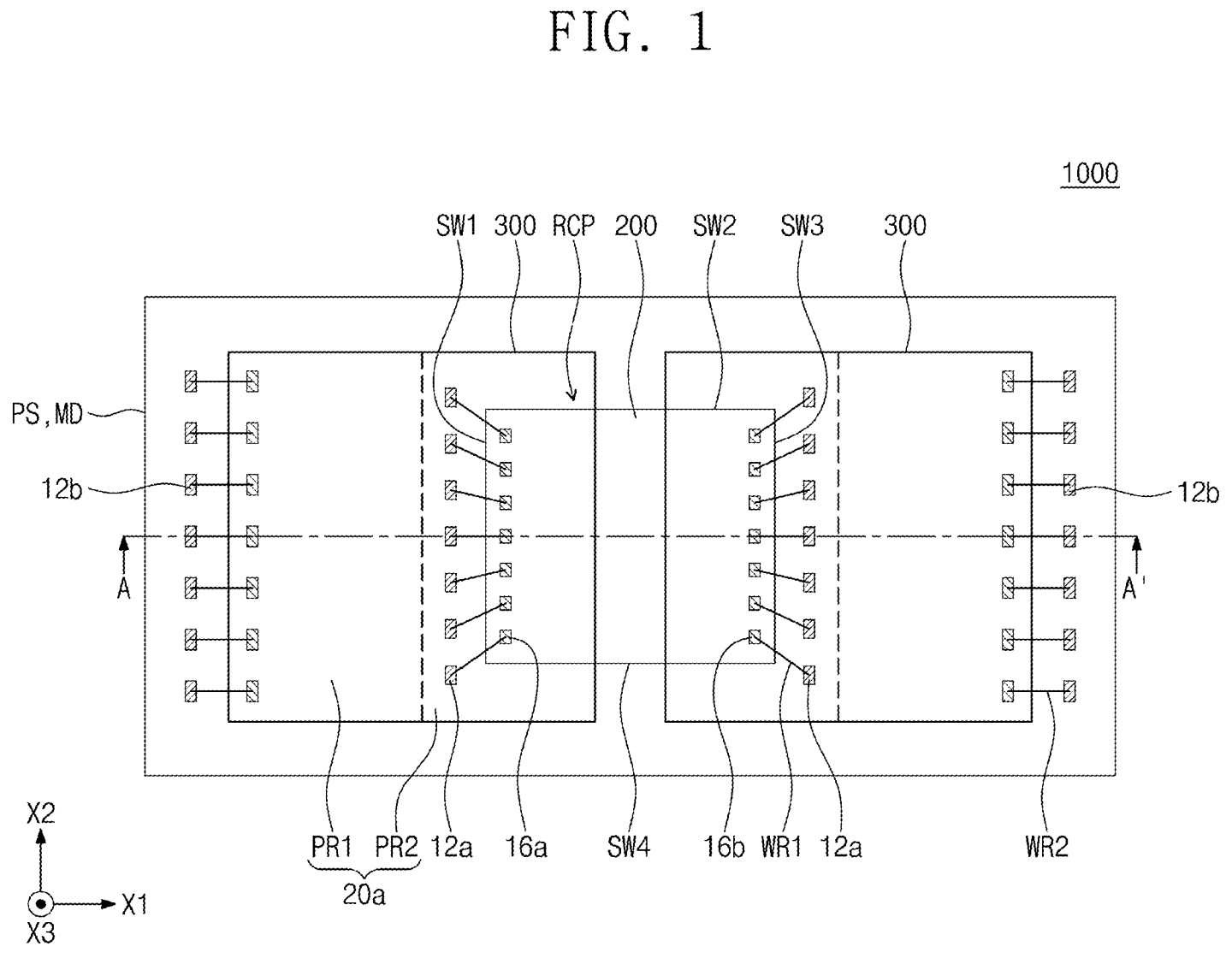
Figure 2:
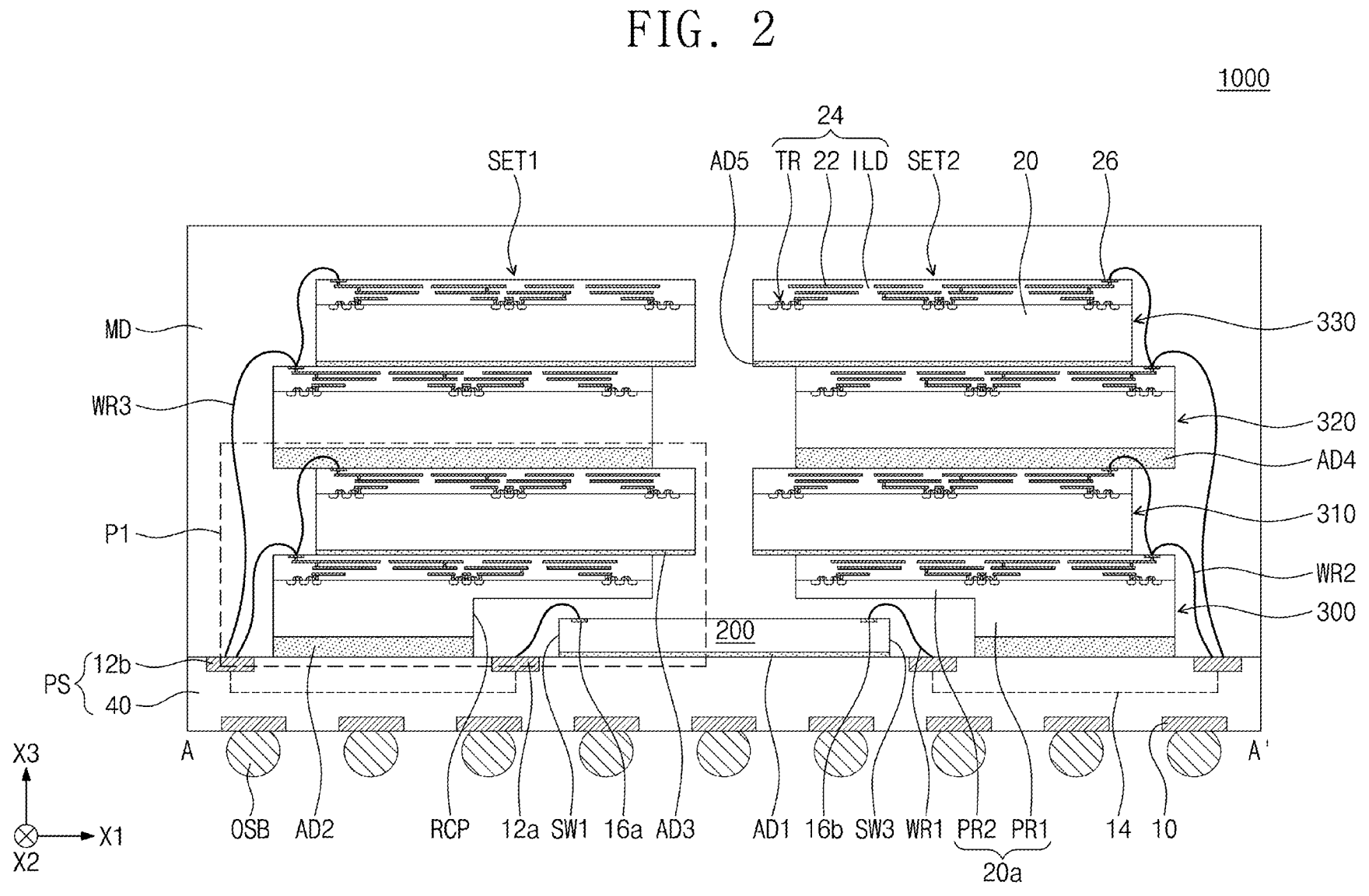

FIG. 1 is a plan view illustrating a semiconductor package according to an embodiment. FIG. 2 is a cross-sectional view along line A-A' of FIG. 1, and FIG. 3 is an enlarged sectional view of portion 'P1' of FIG. 2.

Referring to FIGS. 1 to 3, in a semiconductor package 1000 according to the present embodiment, a first semiconductor chip 200 may be mounted on a center region of a package substrate PS. Second to fifth semiconductor chips 300, 310, 320, and 330 may be sequentially stacked on regions of the package substrate PS which are located at both sides of the first semiconductor chip 200. The second to fifth semiconductor chips 300, 310, 320, and 330, the first semiconductor chip 200, and the package substrate PS may be covered with a mold layer MD.

The package substrate PS may be, e.g., a double-sided or multi-layered printed circuit board. In an embodiment, the package substrate PS may be a redistribution substrate. The package substrate PS may include an insulating portion 40, first and second upper conductive pads 12a and 12b disposed on a top surface of the insulating portion 40, and ball lands 10 disposed on a bottom surface of the insulating portion 40. Outer connection terminals OSB may be bonded to the ball lands 10. The outer connection terminals OSB may include at least one of, e.g., conductive bumps, conductive pillars, or solder balls. The outer connection terminals OSB may be formed of or include at least one of, e.g., tin, lead, silver, copper, aluminum, gold, or nickel.

The package substrate PS may further include internal lines 14 disposed in the insulating portion 40. The internal lines 14 may be provided to connect some of the first and second upper conductive pads 12a and 12b to each other or to connect others of the first and second upper conductive pads 12a and 12b to the ball lands 10. The first and second upper conductive pads 12a and 12b, the ball lands 10, and the internal lines 14 may be formed of or include at least one of metallic materials (e.g., titanium, copper, aluminum, nickel, and gold). The insulating portion 40 may include a plurality of insulating layers which are stacked. The insulating layers may be formed of or include at least one of thermosetting resins (e.g., epoxy resin), thermoplastic resins (e.g., polyimide), composite materials (e.g., prepreg or fire resist-4 (FR4)), in which a reinforcement element (e.g., glass fiber and/or inorganic filler) is pre-impregnated with a thermoplastic or thermosetting resin matrix, photo-curable resin and/or photo-imagable dielectric (PID).

In an embodiment, the first semiconductor chip 200 may be configured to have a different function from the second to fifth semiconductor chips 300, 310, 320, and 330. For example, all of the second to fifth semiconductor chips 300, 310, 320, and 330 may be memory chips of the same kind, and the first semiconductor chip 200 may be a logic or control chip, which is used to control the second to fifth semiconductor chips 300, 310, 320, and 330. Alternatively, the first semiconductor chip 200 may be one of, e.g., a microelectromechanical system (MEMS) chip, an application-specific integrated circuit (ASIC) chip, or a central processing unit (CPU) chip. The memory chip may be, e.g., a NAND chip, a VNAND chip, a dynamic random-access memory (DRAM) chip, a static random-access memory (SRAM) chip, an electrically erasable programmable read-only memory (EEPROM) chip, a phase change random-access memory (PRAM) chip, a magnetoresistive random-access memory (MRAM) chip, a resistive random-access memory (ReRAM) chip, a high bandwidth memory (HBM) chip, or a hybrid memory cubic (HMC) chip. In an embodiment, the second to fifth semiconductor chips 300, 310, 320, and 330 may be of different kinds.

The first semiconductor chip 200 may include first chip first upper pads 16a and first chip second upper pads 16b, which are disposed on a top surface of the first semiconductor chip 200. The first chip first upper pads 16a and the first chip second upper pads 16b may be electrically connected to the first upper conductive pads 12a by first wires WR1, respectively. The first semiconductor chip 200 may have first to fourth chip side surfaces SW1 to SW4 in a clockwise direction (FIG. 1). The first semiconductor chip 200 may have a first thickness T1 (FIG. 3). Upper portions of the first wires WR1, which are located above the first semiconductor chip 200, may have a first height H1 from a top surface 200_U of the first semiconductor chip 200 (FIG. 3).

For example, as illustrated in FIGS. 1-3, the first semiconductor chip 200 may be mounted on the package substrate PS in a wire bonding manner. In another example, the first semiconductor chip 200 may be mounted in a flip-chip bonding manner.

In an embodiment, the second to fifth semiconductor chips 300, 310, 320, and 330 may be configured to have the same features as each other. For example, the second to fifth semiconductor chips 300, 310, 320, and 330 may have the same function, the same electrical circuit structure, and the same size. For example, each of the second to fifth semiconductor chips 300, 310, 320, and 330 may have the first width W1 of FIG. 3 in a first direction X1 and may have a second width W2 of FIG. 4B in a second direction X2. Each of the second to fifth semiconductor chips 300, 310, 320, and 330 may have the second thickness T2 of FIG. 3.

Each of the second to fifth semiconductor chips 300, 310, 320, and 330 may include a semiconductor substrate 20 or 20a and a circuit layer 24. The semiconductor substrate 20 or 20a may include a top surface 20U and a bottom surface 20B, which are opposite to each other. The circuit layer 24 may be disposed on the top surface 20U of the semiconductor substrate 20. The circuit layer 24 may include transistors TR, an interlayer insulating layer ILD covering the transistors TR, and interconnection patterns 22 disposed in the interlayer insulating layer ILD. The interlayer insulating layer ILD may be formed of or include at least one of, e.g., silicon oxide, silicon nitride, silicon oxynitride, porous insulating materials and may have a single- or multi-layered structure. Second chip upper pads 26 may be disposed in an uppermost portion of the interlayer insulating layer ILD and may be connected to the interconnection patterns 22.

Figure 4A:
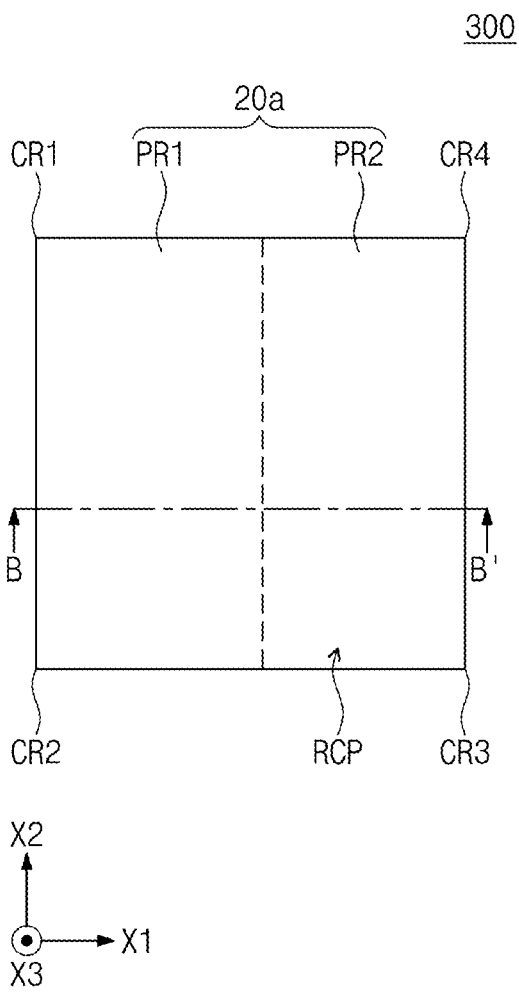
FIG. 4A is a plan view of a second semiconductor chip according to an embodiment.
Figure 4B:
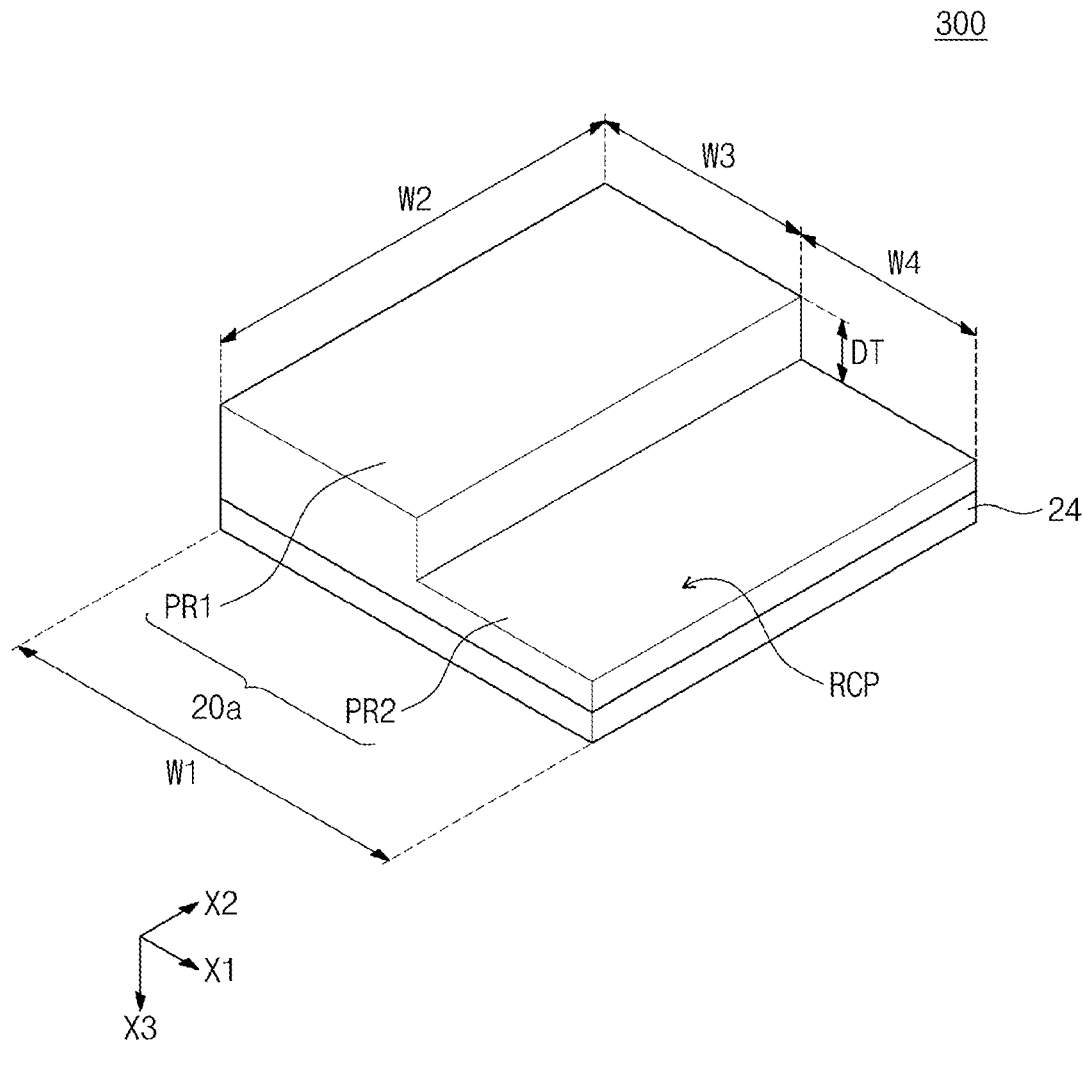
FIG. 4B is a perspective view of the second semiconductor chip having the planar structure of FIG. 4A.

FIG. 4A is a plan view illustrating the second semiconductor chip 300 of FIGS. 1-3. FIG. 4B is a perspective view illustrating the second semiconductor chip 300. It is noted that the second semiconductor chip 300 of FIG. 3 corresponds to a cross-section along line B-B' of FIG. 4A, and FIG. 4B illustrates an inverted structure of the second semiconductor chip 300 of FIG. 3.

Referring to FIGS. 1 to 4B, the lowermost one of the second to fifth semiconductor chips 300, 310, 320, and 330 (i.e., the second semiconductor chip 300) may have a recessed region RCP, in which the first semiconductor chip 200 is inserted. The recessed region RCP may be defined by the bottom surface 20B of the semiconductor substrate 20a of the second semiconductor chip 300. In an embodiment, the semiconductor substrate 20a of the second semiconductor chip 300 may include a first substrate portion PR1 and a second substrate portion PR2. The first substrate portion PR1 may have a third thickness T3. The second substrate portion PR2 may have a fourth thickness T4 that is smaller than the third thickness T3. The first substrate portion PR1 may protrude relative to the second substrate portion PR2, e.g., along the first direction X1, and may be referred to as a 'protruding portion'. A bottom surface of the second substrate portion PR2 may be located at a level different from a bottom surface of the first substrate portion PR1, e.g., relative to the package substrate PS along the third direction X3. The recessed region RCP may be referred to as a 'stepped region'. The recessed region RCP may not be formed in each of the third to fifth semiconductor chips 310, 320, and 330, e.g., the recessed region RCP may be formed only in the second semiconductor chip 300 among the second to fifth semiconductor chips 300 to 330 to accommodate the first semiconductor chip 200 therein.

When viewed in the plan view of FIG. 4A, the second semiconductor chip 300 may include four corners CR1 to CR4 arranged in a counter-clockwise direction. The first substrate portion PR1 may overlap the first and second corners CR1 and CR2 but may be spaced apart from the third and fourth corners CR3 and CR4. When viewed in a plan view, each of the first and second substrate portions PR1 and PR2 may have a rectangular shape.

In the embodiment of FIG. 4B, when measured in the first direction X1, the first substrate portion PR1 may have a third width W3 and the second substrate portion PR2 may have a fourth width W4. The third width W3 may be equal to or different from the fourth width W4. A sum of the third and fourth widths W3 and W4 may equal the first width W1. The fourth width W4 may be about 10% to about 90% of the first width W1. When measured in the second direction X2, each of the first and second substrate portions PR1 and PR2 may have the second width W2.

Figure 5:
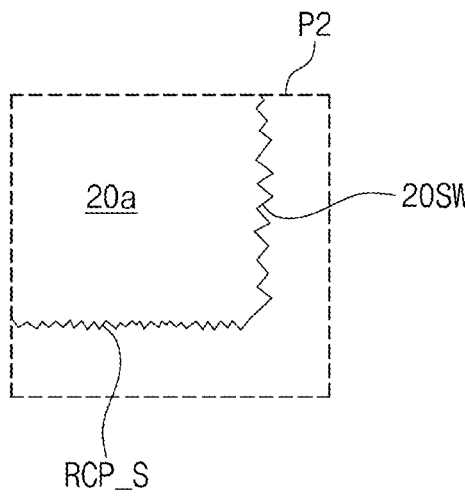
FIG. 5 is an enlarged cross-sectional view of portion 'P2' of FIG. 3.

FIG. 5 is an enlarged cross-sectional view of portion 'P2' of FIG. 3. Portion P2 illustrated an enlarged view of a corner of the second substrate portion PR2.

Referring to FIG. 5, a surface RCP_S of the recessed region RCP of the semiconductor substrate 20*a* (i.e., a surface of the second substrate portion PR2 facing the first semiconductor chip 200), which is included in the second semiconductor chip 300, may have a first surface roughness. Further, a side surface 20SW of the semiconductor substrate 20*a* (i.e., a surface of the second substrate portion PR2 extending from and perpendicular to the surface RCP_S) may have a second surface roughness different from the first surface roughness. In an embodiment, the first surface roughness may be smaller than the second surface roughness. Alternatively, the first surface roughness may be greater than the second surface roughness.

Referring back to FIGS. 3 and 4B, the recessed region RCP may have a first depth DT from the bottom surface 20B of the first substrate portion PR1 of the semiconductor substrate 20*a*. The first depth DT may be equal to a difference between the third thickness T3 and the fourth thickness T4. The first depth DT may be equal to or larger than a sum of the first thickness T1 of the first semiconductor chip 200 and the first height H1 of an upper portion of the first wire WR1 located above the first semiconductor chip 200. For example, the third thickness T3 may range from about 600 μm to about 800 μm, and the fourth thickness T4 may range from about 20 μm to about 710 μm. For example, the first depth DT may range from about 90 μm to about 780 μm. For example, the first thickness T1 may be about 60 μm, and the first height H1 may be about 30 μm.

The first semiconductor chip 200 may be attached to the package substrate PS using a first adhesive layer AD1 of a fifth thickness T5. A second adhesive layer AD2 of a sixth thickness T6 may be interposed between the first substrate portion PR1 of the second semiconductor chip 300 and the package substrate PS. A third adhesive layer AD3 of a seventh thickness T7 may be interposed between the second semiconductor chip 300 and the third semiconductor chip 310. A fourth adhesive layer AD4 of an eighth thickness T8 may be interposed between the third semiconductor chip 310 and the fourth semiconductor chip 320. A fifth adhesive layer AD5 may be interposed between the fourth semiconductor chip 320 and the fifth semiconductor chip 330. The fifth thickness T5 may be equal to or smaller than the sixth thickness T6. Accordingly, the first semiconductor chip 200 may be stably inserted in the recessed region RCP. In addition, the fifth thickness T5 may be equal to or smaller than the eighth thickness T8. The seventh thickness T7 may be smaller than the sixth thickness T6 and/or the eighth thickness T8. Accordingly, it may be possible to reduce a total thickness of the semiconductor package 1000. In an embodiment, all of the first to fifth adhesive layers AD1 to AD5 may be formed of or include the same adhesive material. At least one of the first to fifth adhesive layers AD1 to AD5 may be a die attach film (DAF).

The third and fifth semiconductor chips 310 and 330 may protrude relative to the second and fourth semiconductor chips 300 and 320 in the first direction X1. A second wire WR2 may be provided to connect the second chip upper pad 26 of the third or second semiconductor chip 310 or 300 to the second upper conductive pad 12*b*. An upper portion of the second wire WR2 may protrude from a top surface of the third semiconductor chip 310 by the first height H1. The upper portion of the second wire WR2 may be buried in the fourth adhesive layer AD4. The eighth thickness T8 may be equal to or larger than the first height H1. A third wire WR3 may be provided to connect the second chip upper pad 26 of the fifth or fourth semiconductor chip 330 or 320 to the second upper conductive pad 12*b*. An upper portion of the third wire WR3 may protrude from a top surface of the fifth semiconductor chip 330 by the first height H1.

As illustrated in FIG. 2, the second to fifth semiconductor chips 300, 310, 320, and 330 of a first set SET1, i.e., a first stack, may be disposed on the first chip side surface SW1 of the first semiconductor chip 200, and the second to fifth semiconductor chips 300, 310, 320, and 330 of a second set SET2, e.g., a second stack, may be disposed on a third chip side surface SW3 of the first semiconductor chip 200. The second set SET2 and the first set SET1, e.g., the two stacks, may be spaced apart from each other, e.g., along the first direction X1, and may have a mirror symmetric structure, e.g., with respect to the third direction X3. The mold layer MD may extend into a region between the second to fifth semiconductor chips 300, 310, 320, and 330 of the first set SET1 and the second to fifth semiconductor chips 300, 310, 320, and 330 of the second set SET2 to fill the recessed regions RCP, e.g., around the first semiconductor chip 200. The mold layer MD may be formed of or include an insulating resin (e.g., epoxy molding compound (EMC)). The mold layer MD may further include fillers, which are distributed in the insulating resin. The filler may be an inorganic filler (e.g., containing at least one of silica, alumina, or titania) or an organic filler (e.g., containing a polymeric material).

For example, as illustrated in FIG. 2, the number of the semiconductor chips 300, 310, 320, and 330, which overlap an end portion of the first semiconductor chip 200 and constitute one set, may be four. In another example, the number of the semiconductor chips overlapping the end portion of the first semiconductor chip 200 may be 1 to 3 or may be equal to or larger than 5.

In the semiconductor package 1000 according to the present embodiment, the lowermost one of the second to fifth semiconductor chips 300, 310, 320, and 330 (i.e., the second semiconductor chip 300) may be provided to have the recessed region RCP, in which the first semiconductor chip 200 can be inserted. Accordingly, it may be possible to remarkably reduce at least one of horizontal and/or vertical sizes of the semiconductor package 1000. For example, the semiconductor package 1000 according to the present embodiment may have a reduced bond-level thickness. Accordingly, it may be possible to reduce fabrication cost and turnaround time (TAT).

If the second semiconductor chip 300 does not have the recessed region RCP, the first semiconductor chip 200, which controls the second to fifth semiconductor chips 300, 310, 320, and 330, may be placed around, e.g., horizontally adjacent to, the second to fifth semiconductor chips 300, 310, 320, and 330, and in this case, a horizontal size of a semiconductor package may be increased. In certain cases, the first semiconductor chip 200 could be potentially disposed below the second to fifth semiconductor chips 300, 310, 320, and 330 using a spacer or a supporter, but in this case, a vertical size of a semiconductor package may be increased.

In contrast, according to an embodiment, by stacking memory chips, e.g., the second to fifth semiconductor chips 300, 310, 320, and 330, and inserting the first semiconductor chip 200 within a recess of a lowest one of the stacked memory chip, it may be possible to realize a highly-integrated compact semiconductor package with large memory capacity. In addition, according to an embodiment, it may be unnecessary to provide a spacer or a supporter.

Figure 6:
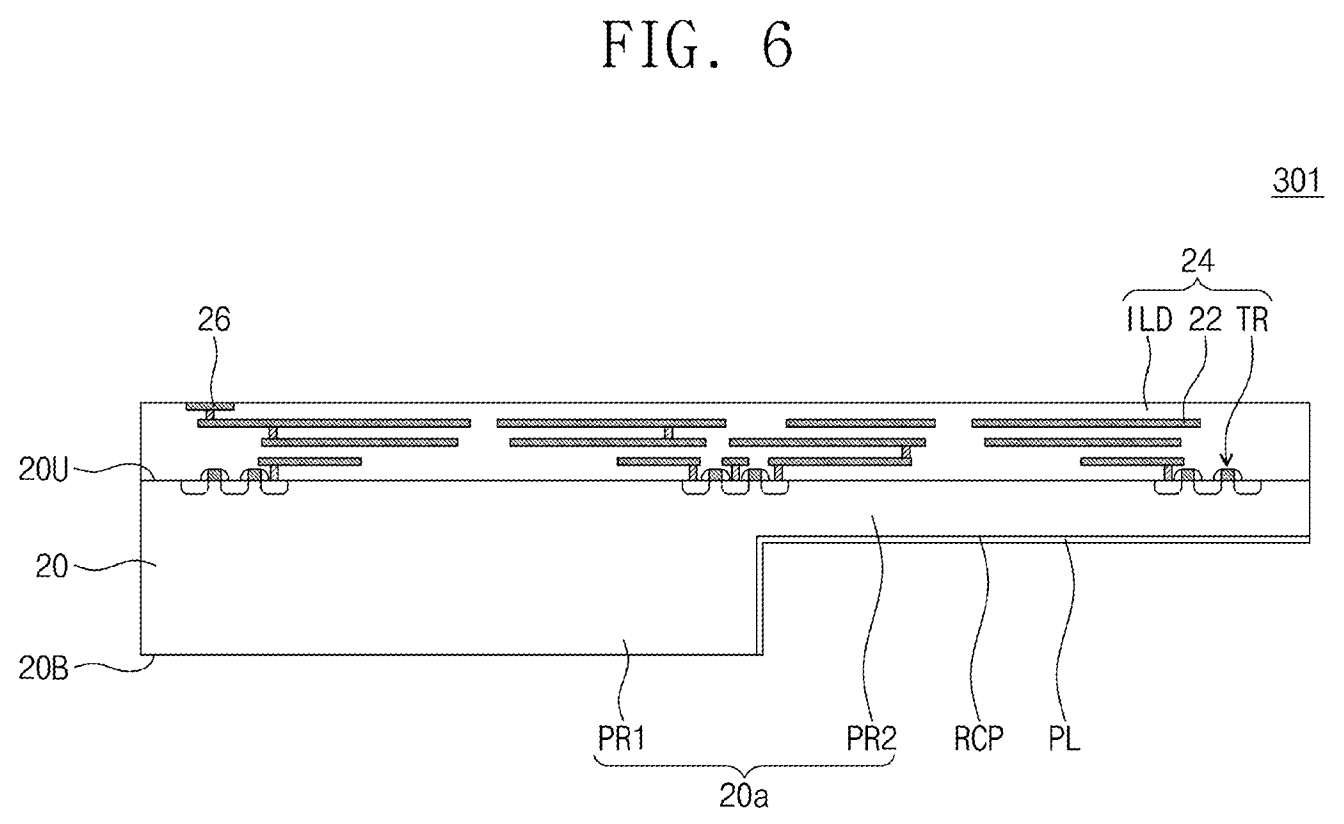

FIG. 6 is a cross-sectional view illustrating a second semiconductor chip according to an embodiment.

Referring to FIG. 6, a second semiconductor chip 301 according to the present embodiment may further include a protection layer PL covering a surface of the recessed region RCP, e.g., the protection layer PL may cover surfaces of the recessed region RCP that are facing the first semiconductor chip 200. In other words, the protection layer PL may cover a side surface of the first substrate portion PR1 of the semiconductor substrate 20a of the second semiconductor chip 301 and a bottom surface of the second substrate portion PR2. The protection layer PL may be formed of or include at least one of inorganic materials (e.g., silicon oxide, silicon nitride, and/or silicon oxynitride) or polymeric materials (e.g., polyimide). The protection layer PL may be formed by a deposition process (e.g., a chemical vapor deposition (CVD) process or an atomic layer deposition (ALD) process) or a spin coating process.

In detail, the recessed region RCP may be formed by a plasma etching process, as will be described with reference to FIGS. 8A and 8B. If the surface of the recessed region RCP is damaged during the etching process, the protection layer may be provided on the surface of the recessed region RCP to cure the etch damage on the surface of the recessed region RCP. The protection layer PL may also be configured to prevent hydrogen atoms from being diffused into the semiconductor substrate 20a through the surface of the recessed region RCP.

Figure 7A:
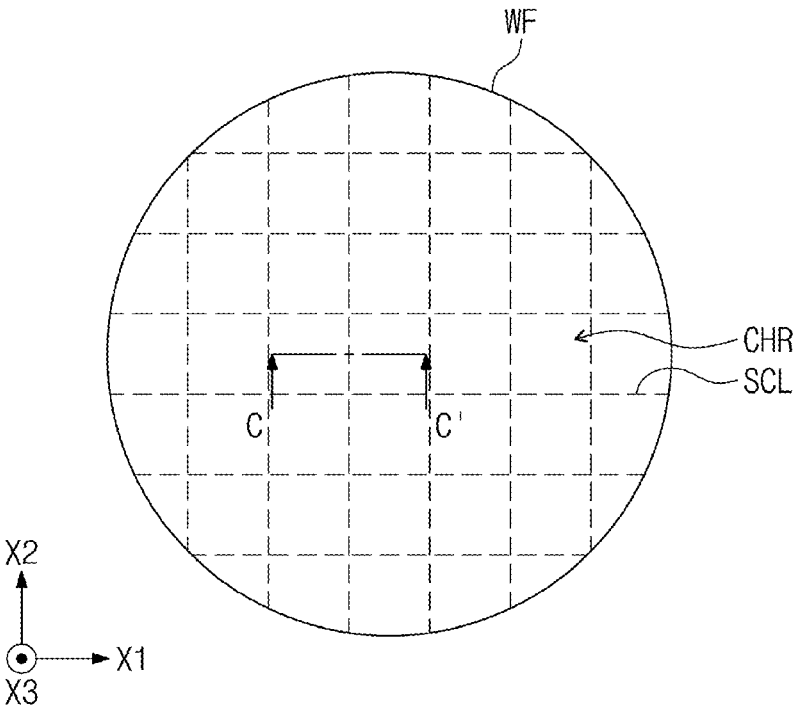
FIGS. 7A and 8A are plan views of stages in a process of fabricating the second semiconductor chip of FIG. 2.
Figure 7B:
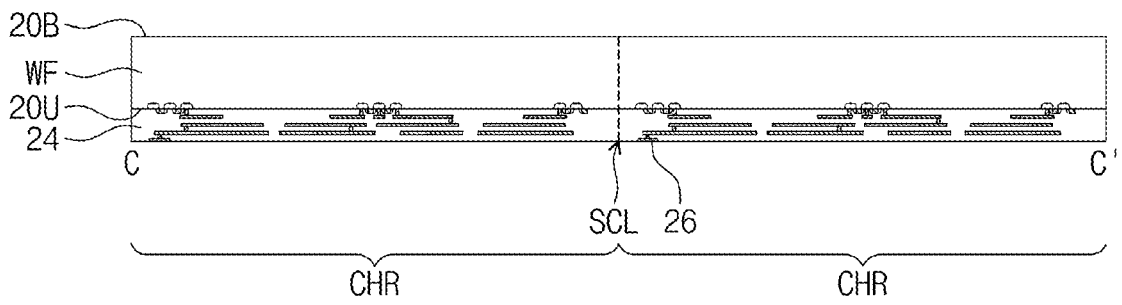
FIGS. 7B and 8B are cross-sectional views along line C-C' of FIGS. 7A and 8A.
Figure 8A:
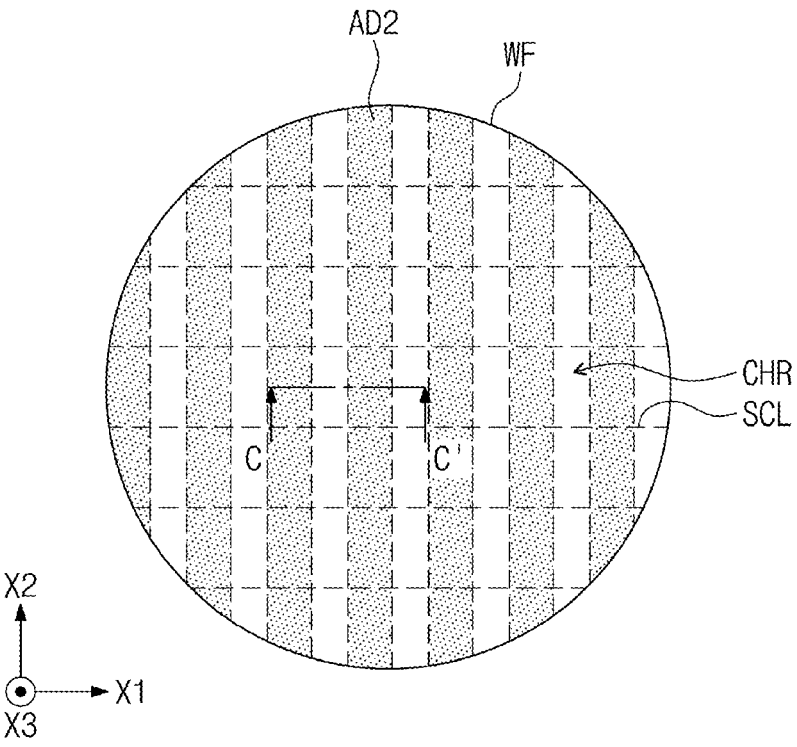

FIGS. 7A and 8A are plan views illustrating stages in a process of fabricating the second semiconductor chip 300 of FIG. 2. FIGS. 7B and 8B are cross-sectional views taken along lines C-C' of FIGS. 7A and 8A, respectively. FIGS. 9A to 9D are cross-sectional views illustrating stages in a process of fabricating the semiconductor package 1000 of FIG. 2.

Referring to FIGS. 7A and 7B, a semiconductor wafer WF having top and bottom surfaces 20U and 20B, which are opposite to each other, may be prepared. The semiconductor wafer WF may be, e.g., a single-crystalline silicon wafer. The semiconductor wafer WF may include a plurality of chip regions CHR and a scribe lane SCL therebetween. The chip regions CHR may be two-dimensionally arranged in the first and second directions X1 and X2. The circuit layer 24 may be formed on the top surface 20U of the semiconductor wafer WF through a conventional fabrication process.

Figure 8B:
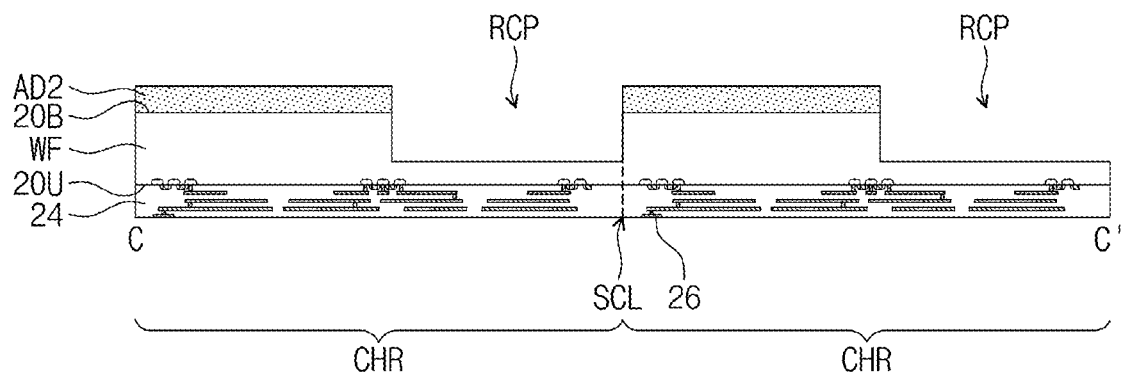

Referring to FIGS. 8A and 8B, the second adhesive layer AD2 may be formed on the bottom surface 20B of the semiconductor wafer WF. The second adhesive layer AD2 may be formed to cover a portion of each chip region CHR and to expose the other portion of each chip region CHR. A side surface of the second adhesive layer AD2 may be aligned to the scribe lane SCL. On the semiconductor wafer WF, the second adhesive layer AD2 may form a plurality of line shaped patterns extending in the second direction X2. A plasma etching process may be performed to etch an exposed portion of the semiconductor wafer WF, which is not covered with the second adhesive layer AD2, and thus, the recessed regions RCP may be formed in the chip regions CHR, respectively. In an embodiment, during the plasma etching process, the second adhesive layer AD2 may serve as an etch mask. After the plasma etching process, a laser sawing process may be performed to cut the semiconductor wafer WF along the scribe lane SCL. Accordingly, the second semiconductor chip 300 may be fabricated, as described with reference to FIGS. 3, 4A, and 4B.

For example, as a result of the cutting of the semiconductor wafer WF, the semiconductor substrate 20a of the second semiconductor chip 300 may be formed. In an embodiment, the laser sawing or cutting process may be performed on the semiconductor wafer WF, to which the second adhesive layer AD2 is attached. Since the recessed region RCP of the second semiconductor chip 300 is formed by the plasma etching process and a side surface of the semiconductor substrate 20a is defined, e.g., cut, by the laser sawing process, the recessed region RCP may have a different surface roughness from the side surface of the semiconductor substrate 20a, as described with reference to FIG. 5.

Figures 9A, 9B:
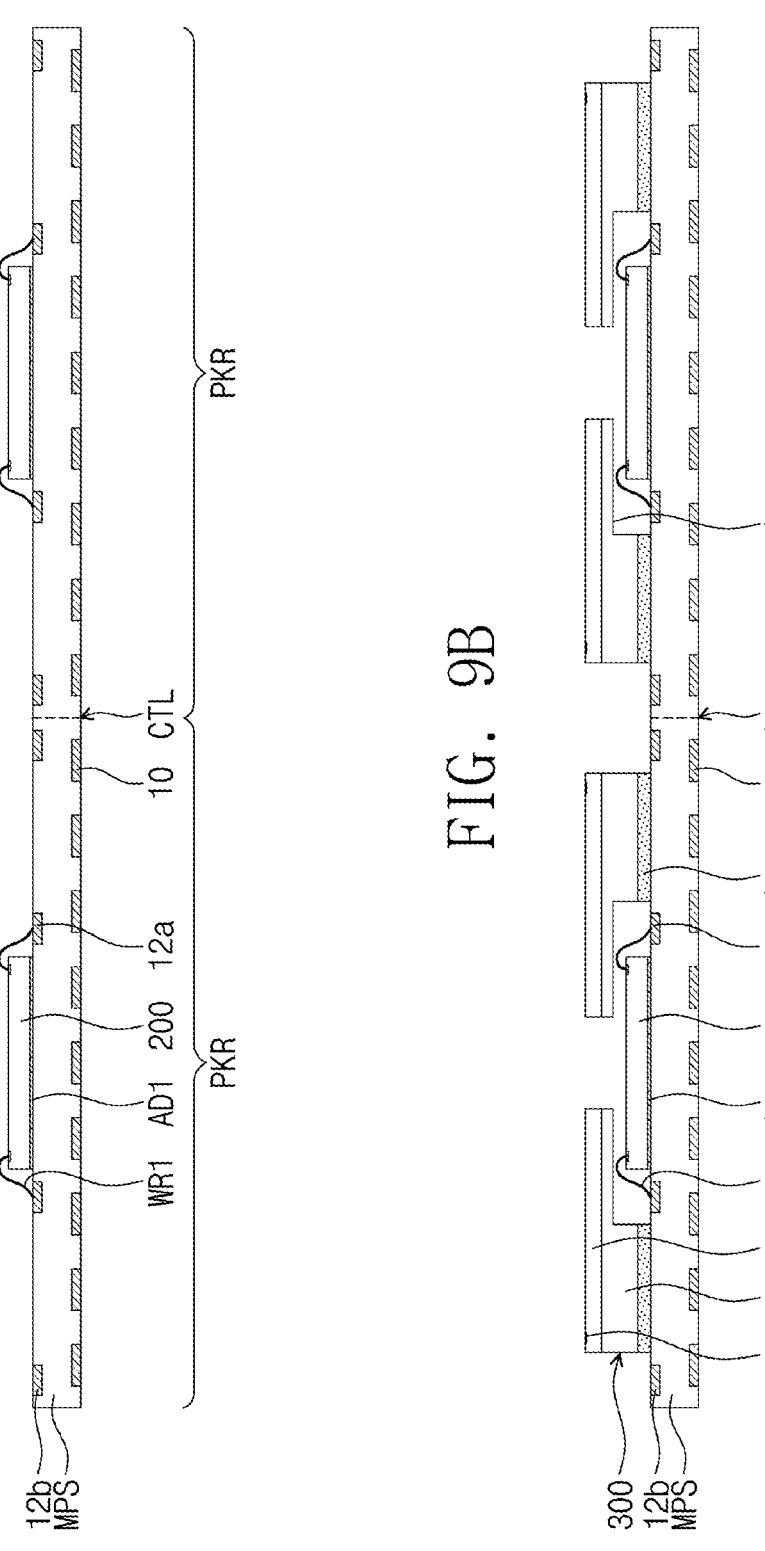
FIGS. 9A to 9D are cross-sectional views of stages in a process of fabricating the semiconductor package of FIG. 2.

Referring to FIG. 9A, a panel substrate MPS may be prepared. The panel substrate MPS may be a panel-level printed circuit board or a redistribution substrate. The panel substrate MPS may include a plurality of unit package regions PKR and a cutting region CTL therebetween. Each of the unit package regions PKR of the panel substrate MPS may include the first and second upper conductive pads 12a and 12b, the ball lands 10, and the internal lines 14 described with reference to FIG. 2. The first semiconductor chips 200 may be respectively attached to the unit package regions PKR of the panel substrate MPS using the first adhesive layers AD1, and then, the first wires WR1 may be formed to connect the first semiconductor chips 200 to the unit package regions PKR.

Referring to FIG. 9B, the second semiconductor chips 300 attached with the second adhesive layer AD2 may be disposed on the panel substrate MPS. Here, a pair of the second semiconductor chips 300 may be disposed at both, e.g., opposite, sides of each of the first semiconductor chips 200, such that each of the first semiconductor chips 200 is placed in the recessed regions RCP of the second semiconductor chips 300. For example, as illustrated in FIG. 9B, a pair of the second semiconductor chips 300 that is at opposite sides of a single first semiconductor chip 200 may be positioned to have their respective second substrate portions face each other and overlap portions of the top surface of the single first semiconductor chips 200, e.g., the respective second substrate portions may overlap opposite edges of the single first semiconductor chip 200. Thereafter, heat may be applied to the second adhesive layer AD2, and in this case, the second adhesive layer AD2 may become a fluidic or gel state and may be attached to the panel substrate MPS.

Figure 9C:
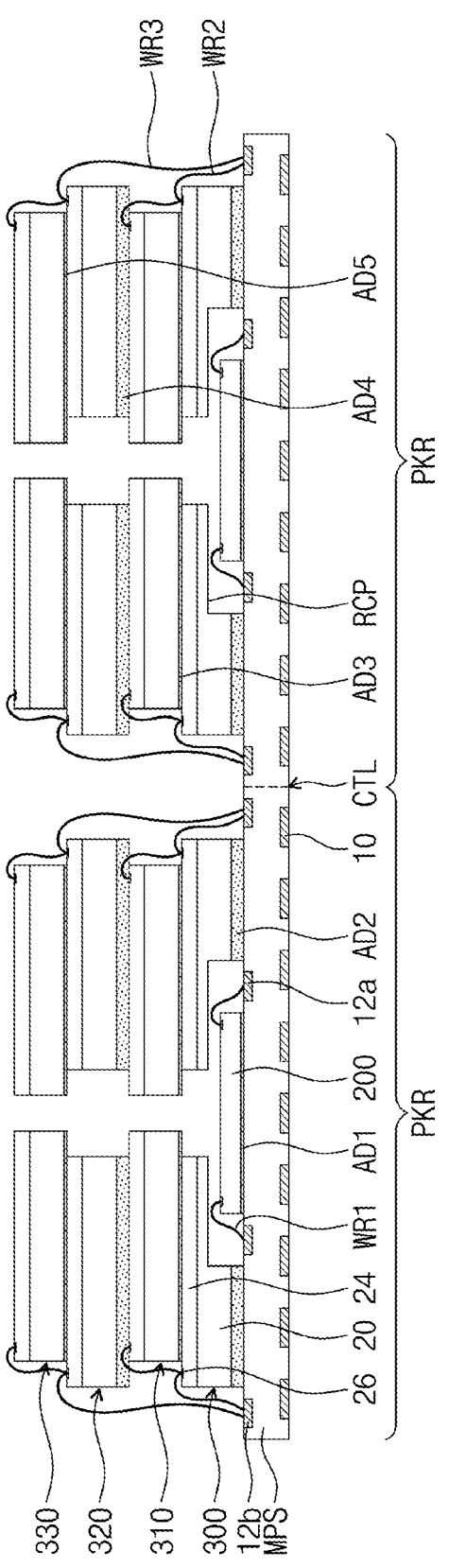

Referring to FIG. 9C, third semiconductor chips 310 may be bonded to the second semiconductor chips 300 by the third adhesive layers AD3 interposed therebetween. Next, the second wires WR2 may be formed to connect the second chip upper pads 26 of the second and third semiconductor chips 300 and 310 to the second upper conductive pads 12b. Fourth semiconductor chips 320 may be bonded to the third semiconductor chips 310 by the fourth adhesive layers AD4 interposed therebetween. Thereafter, heat may be applied to the fourth adhesive layer AD4, and in this case, the fourth adhesive layer AD4 may become a fluidic state and upper portions of the second wires WR2 may be inserted into the fourth adhesive layer AD4. In an embodiment, the eighth thickness T8 of the fourth adhesive layer AD4 may have a relatively large value, as shown in FIG. 3, and this may make it possible to prevent the second wires WR2 from being damaged and to stably attach the fourth semiconductor chips 320 to the third semiconductor chips 310. Thereafter, the fifth semiconductor chips 330 may be bonded to the fourth semiconductor chips 320 by the fifth adhesive layers AD5 interposed therebetween. Next, the third wires WR3 may be formed to connect the second chip upper pads 26 of the fourth and fifth semiconductor chips 320 and 330 to the second upper conductive pads 12b.

Figure 9D:
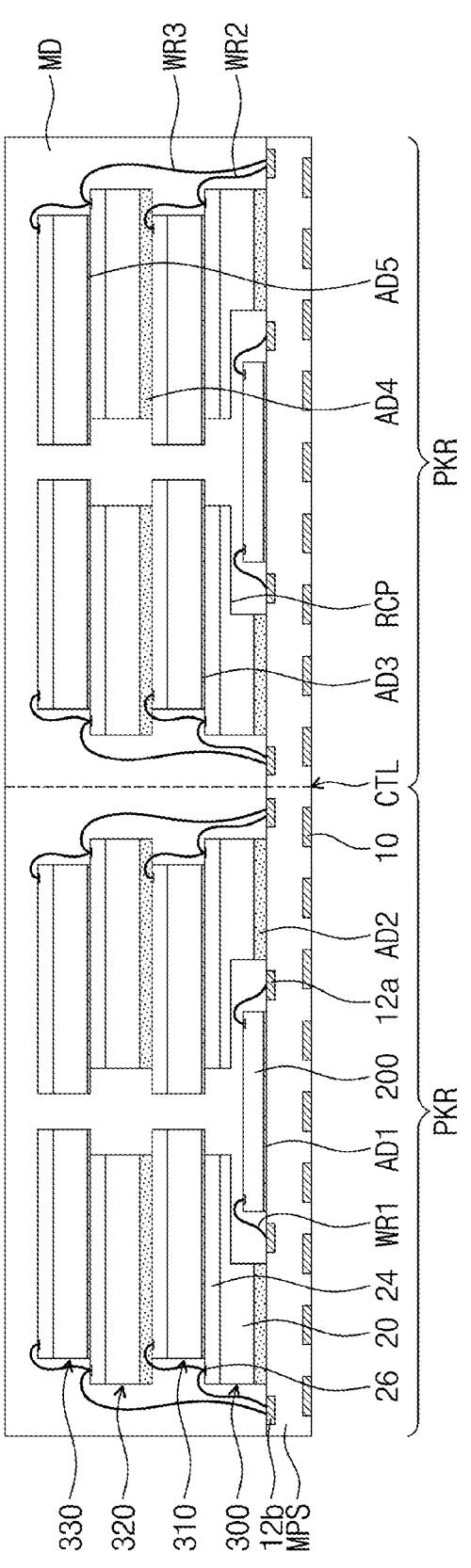

Referring to FIG. 9D, the mold layer MD may be formed on the panel substrate MPS. The formation of the mold layer MD may include placing the panel substrate MPS in a molding cast, supplying an epoxy resin solution into the molding cast, and curing the epoxy resin solution. Here, since the recessed region RCP is formed to penetrate the second semiconductor chip 300 in the second direction X2, a process failure may not occur when the epoxy resin solution is supplied into the molding cast in the second direction X2 of FIG. 1 or 4B. After the formation of the mold layer MD, a singulation process may be performed to cut the panel substrate MPS and the mold layer MD along the cutting region CTL. Accordingly, the semiconductor package 1000 of FIGS. 1 and 2 may be fabricated. For example, the package substrate PS of FIG. 2 may be formed as a result of the cutting of the panel substrate MPS.

Figure 10:
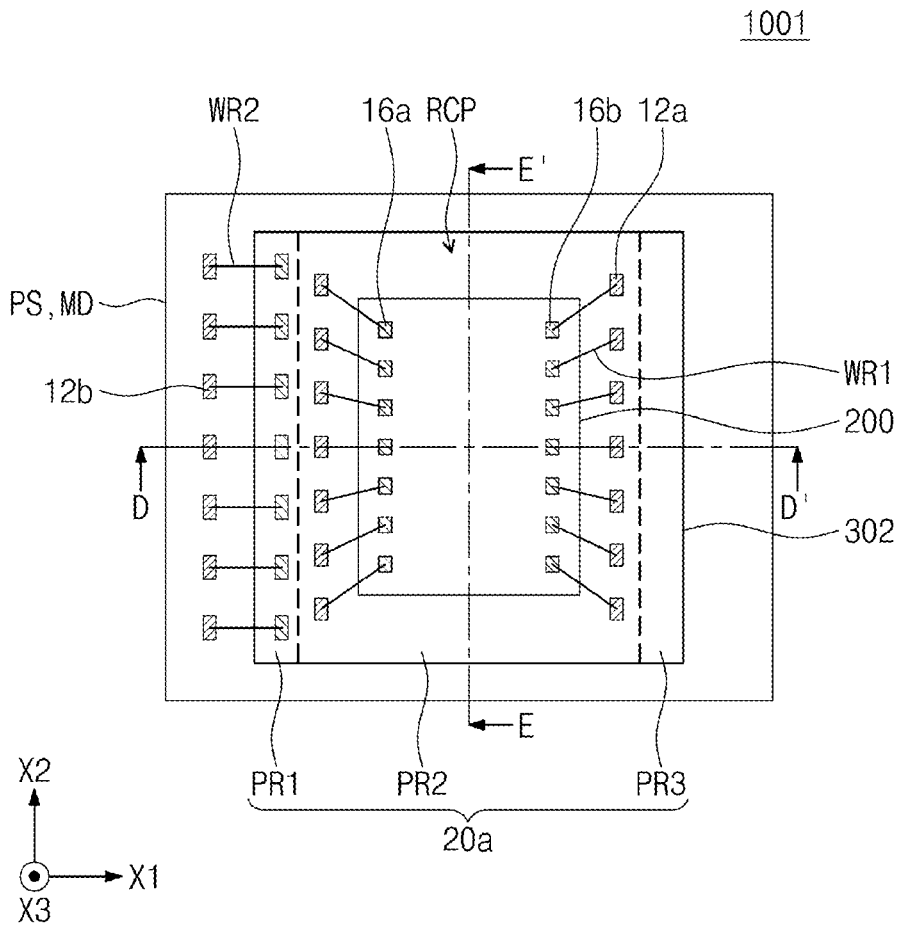
FIG. 10 is a plan view of a semiconductor package according to an embodiment.
Figure 11:
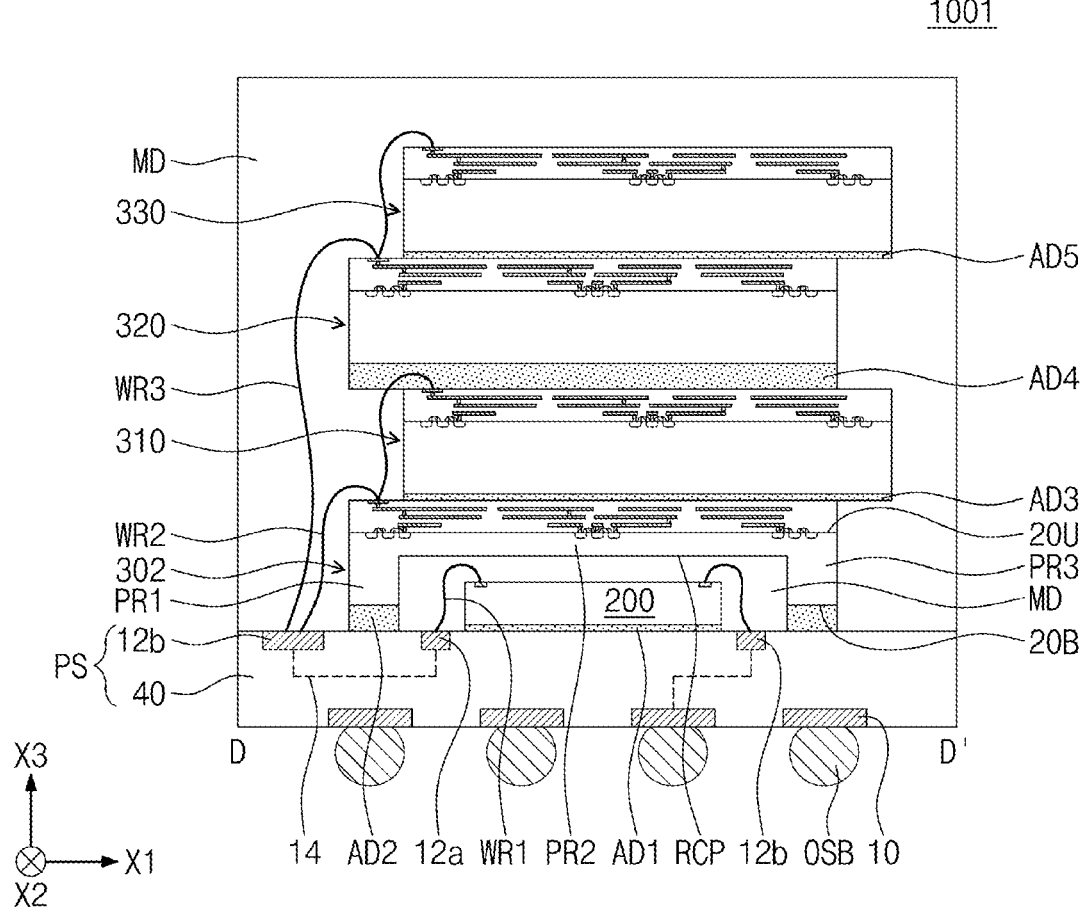
FIG. 11 is a cross-sectional view taken along line D-D' of FIG. 10.
Figure 12:
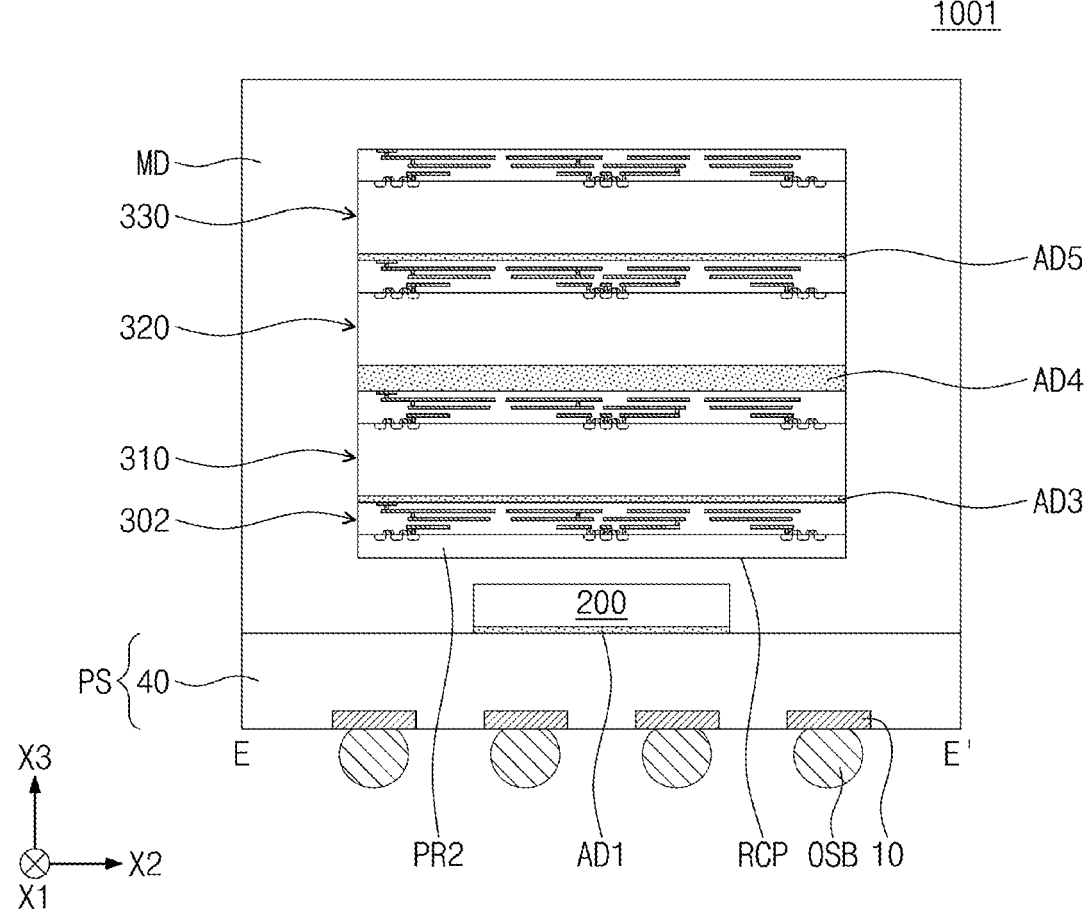
FIG. 12 is a cross-sectional view taken along line E-E' of FIG. 10.
Figure 13:
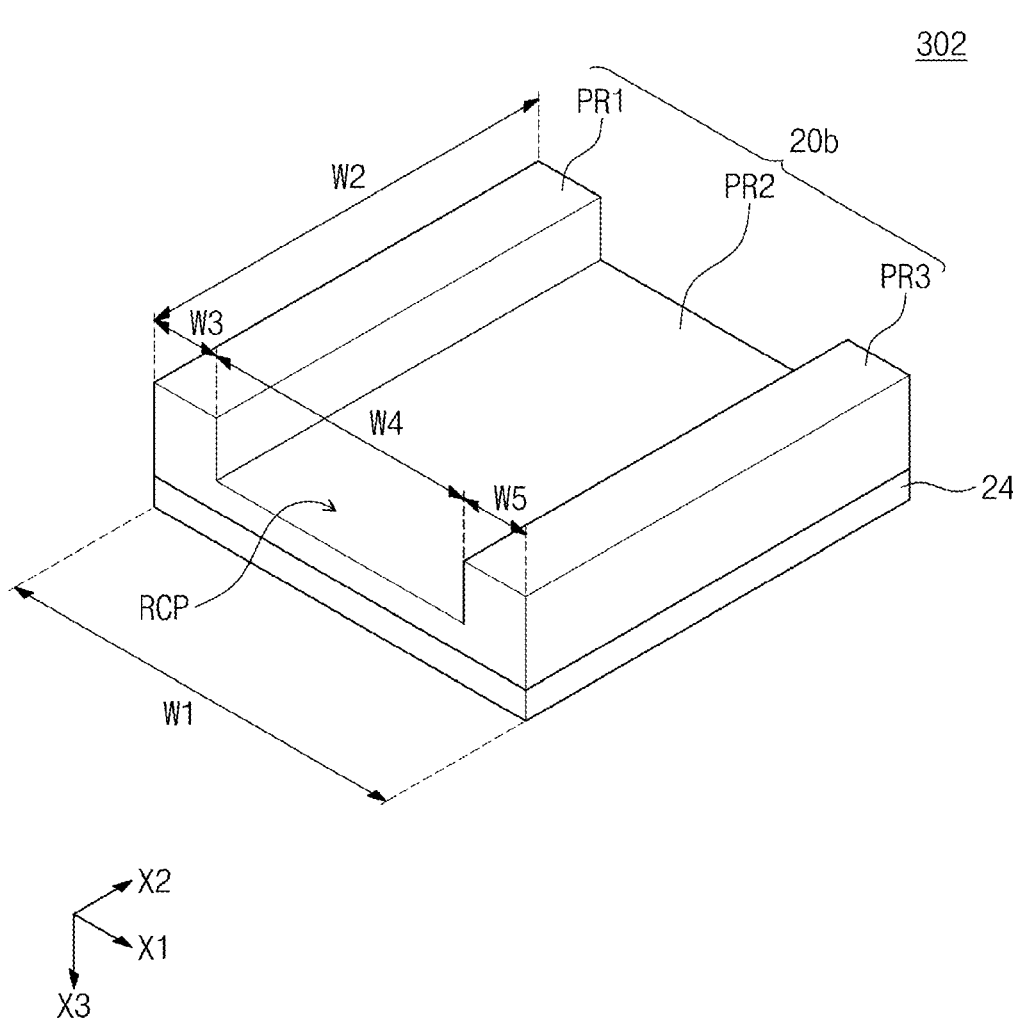
FIG. 13 is a perspective view of a second semiconductor chip in the semiconductor package of FIG. 10.

FIG. 10 is a plan view illustrating a semiconductor package according to an embodiment. FIG. 11 is a cross-sectional view taken along line D-D' of FIG. 10. FIG. 12 is a cross-sectional view taken along line E-E' of FIG. 10. FIG. 13 is a perspective view illustrating a second semiconductor chip in the semiconductor package of FIG. 10. In detail, FIG. 13 is a perspective view illustrating an inverted structure of the second semiconductor chip of FIG. 10.

Referring to FIGS. 10 to 13, in a semiconductor package 1001 according to the present embodiment, the entirety of the first semiconductor chip 200 may be inserted in the recessed region RCP of a, e.g., single, second semiconductor chip 302. A semiconductor substrate 20b of the second semiconductor chip 302 may include a first substrate portion PR1, a second substrate portion PR2, and a third substrate portion PR3, which are arranged in the first direction X1. The first to third substrate portions PR1 to PR3 may be provided to form a single object, e.g., a seamless integrated structure. Each of the first and third substrate portions PR1 and PR3 may have the third thickness T3 of FIG. 3, and the second substrate portion PR2 therebetween may have the fourth thickness T4 of FIG. 3. Accordingly, the recessed region RCP may be formed on the second substrate portion PR2.

When viewed in a plan view, each of the first and third substrate portions PR1 and PR3 may have a shape of a bar or a letter 'I' and may have the second width W2 in the second direction X2. Each of the first and third substrate portions PR1 and PR3 may be referred to as a 'protruding portion'. When measured in the first direction X1, the first substrate portion PR1 may have the third width W3 and the third substrate portion PR3 may have a fifth width W5. The third width W3 may be equal to or different from the fifth width W5. The recessed region RCP may have the fourth width W4 in the first direction X1. The third and fifth widths W3 and W5 may be, each independently, 5-40% of the first width W1. The fourth width W4 may be larger than a width of the first semiconductor chip 200, and in an embodiment, the fourth width W4 may be 50-80% of the first width W1.

The second adhesive layer AD2 may be interposed between the first substrate portion PR1 of the second semiconductor chip 302 and the package substrate PS, and between the third substrate portion PR3 and the package substrate PS. The recessed region RCP may be formed to penetrate the second semiconductor chip 302 horizontally (i.e., from a side surface to an opposite side surface) in the second direction X2. The mold layer MD may extend in the second direction X2 to fill the recessed region RCP. In the present embodiment, the second to fifth semiconductor chips 300, 310, 320, and 330 corresponding to the first set SET1 of FIG. 2 may be stacked on the first semiconductor chip 200.

Although not shown, in the embodiment of FIG. 13, the surface of the recessed region RCP may be covered with the protection layer PL of FIG. 6. Except for the afore-described features, the semiconductor package in the present embodiment may be substantially the same as or similar to that described with reference to FIGS. 1 to 6.

Figure 14A:
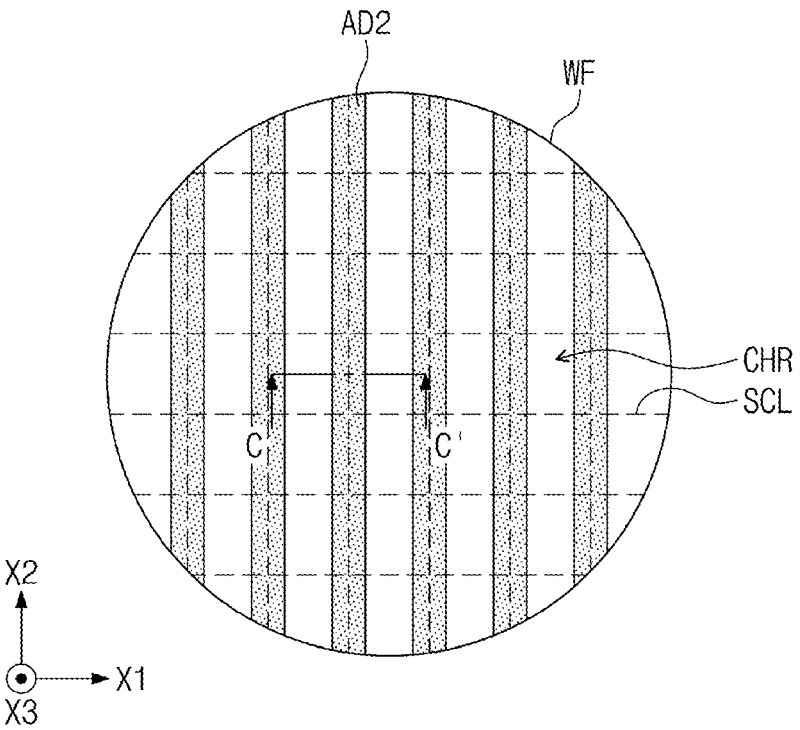
FIG. 14A is a plan view of a process of fabricating the second semiconductor chip of FIG. 13.
Figure 14B:
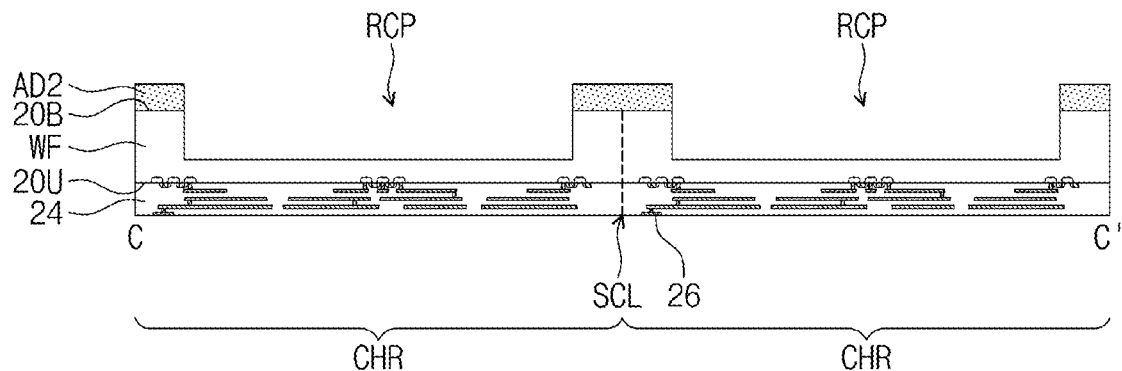
FIG. 14B is a cross-sectional view taken along line C-C' of FIG. 14A.

FIG. 14A is a plan view illustrating a process of fabricating the second semiconductor chip of FIG. 13. FIG. 14B is a cross-sectional view along line C-C' of FIG. 14A.

Referring to FIGS. 14A and 14B, a plurality of second adhesive layers AD2 may be formed on the bottom surface 20B of the semiconductor wafer WF in the state of FIGS. 7A and 7B, and here, the second adhesive layers AD2 may overlap the scribe lane SCL and may extend in the second direction X2. Each of the second adhesive layers AD2 may overlap a pair of the chip regions CHR in common, which are adjacent to each other. Thereafter, a plasma etching process may be performed to form the recessed region RCP. Next, a sawing process may be performed to fabricate the second semiconductor chip 302 of FIG. 13. Except for the afore-described differences, other parts of the fabrication process according to the present embodiment may be performed in the same or similar manner as that in the previous embodiment.

Figure 15:
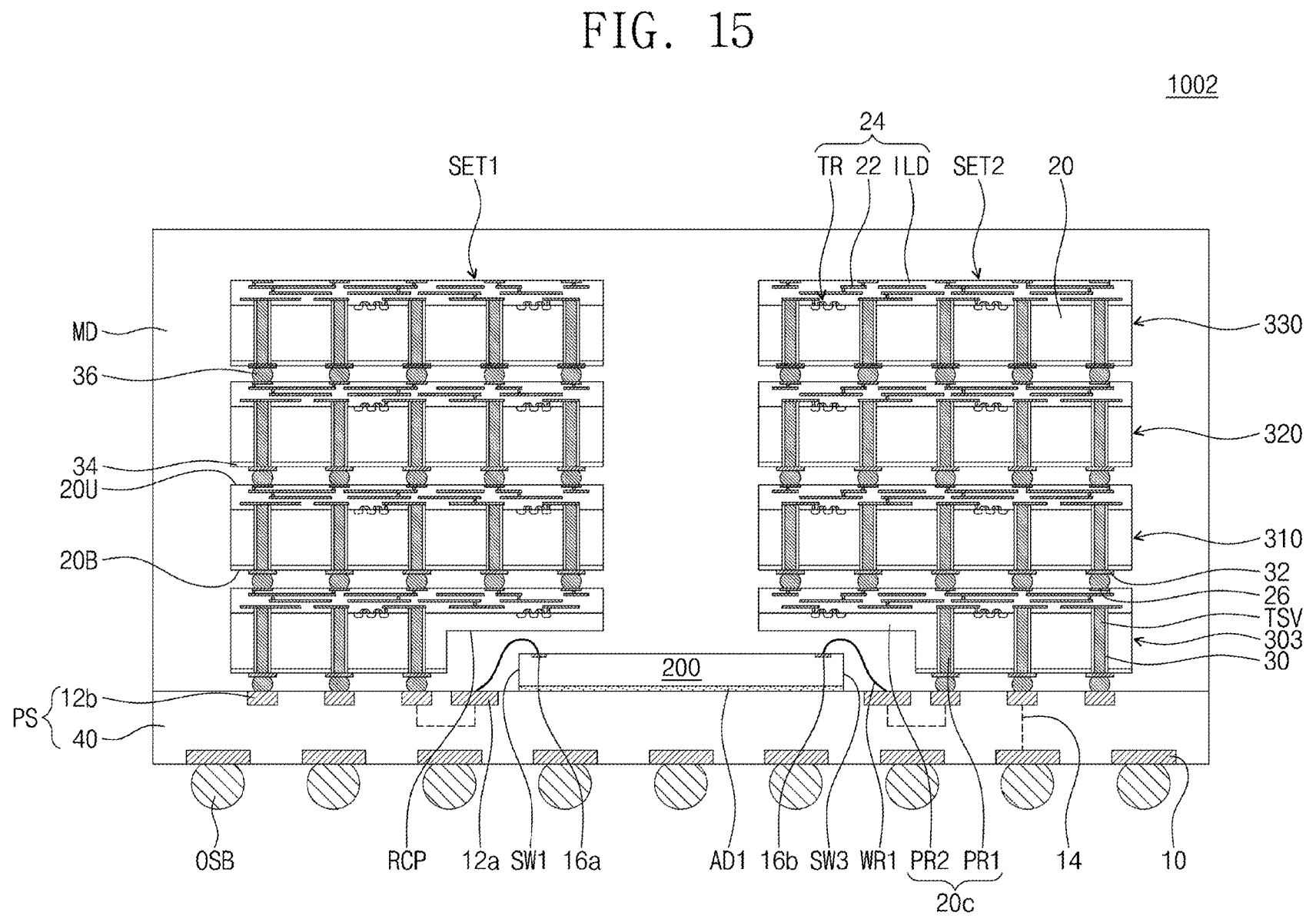

FIG. 15 is a cross-sectional view illustrating a semiconductor package according to an embodiment.

Referring to FIG. 15, in a semiconductor package 1002 according to the present embodiment, each of the second to fifth semiconductor chips 303, 310, 320, and 330 may further include a through via TSV penetrating the semiconductor substrate 20 or 20c. The through via TSV may be formed of or include at least one of metallic materials (e.g., copper, tungsten, titanium, and tantalum). The bottom surface 20B of the semiconductor substrate 20 or 20c may be covered with a back-side protection layer 34. The back-side protection layer 34 may be formed of or include at least one of silicon oxide, silicon nitride, or polyimide. Chip connection pads 32 may be disposed below the back-side protection layer 34. The chip connection pads 32 may be formed of or include at least one of metallic materials (e.g., copper, aluminum, tungsten, nickel, tin, and gold).

The through vias TSV may overlap each other. The through vias TSV may be provided to connect the chip connection pads 32 to some of the interconnection patterns 22. A via insulating layer 30 may be interposed between the through vias TSV and the semiconductor substrate 20 or 20c. The via insulating layer 30 may be formed of or include silicon oxide.

Internal connection terminals 36 may be disposed between the second to fifth semiconductor chips 303, 310, 320, and 330 and may electrically connect the second to fifth semiconductor chips 303, 310, 320, and 330 to each other. In addition, some of the internal connection terminals 36 may be interposed between the second semiconductor chip 300 and the package substrate PS and may connect the second semiconductor chip 300 and the package substrate PS to each other. Each of the internal connection terminals 36 may be at least one of, e.g., solder balls, conductive bumps, or conductive pillars. Each of the internal connection terminals 36 may be formed of or include at least one of, e.g., tin, lead, silver, copper, aluminum, gold, or nickel.

The recessed region RCP may be formed in the second semiconductor chip 303. The number of the through vias TSV in the second semiconductor chip 303 may be equal to or smaller than the number of the through vias TSV in each of the third to fifth semiconductor chips 310, 320, and 330.

Figure 16:
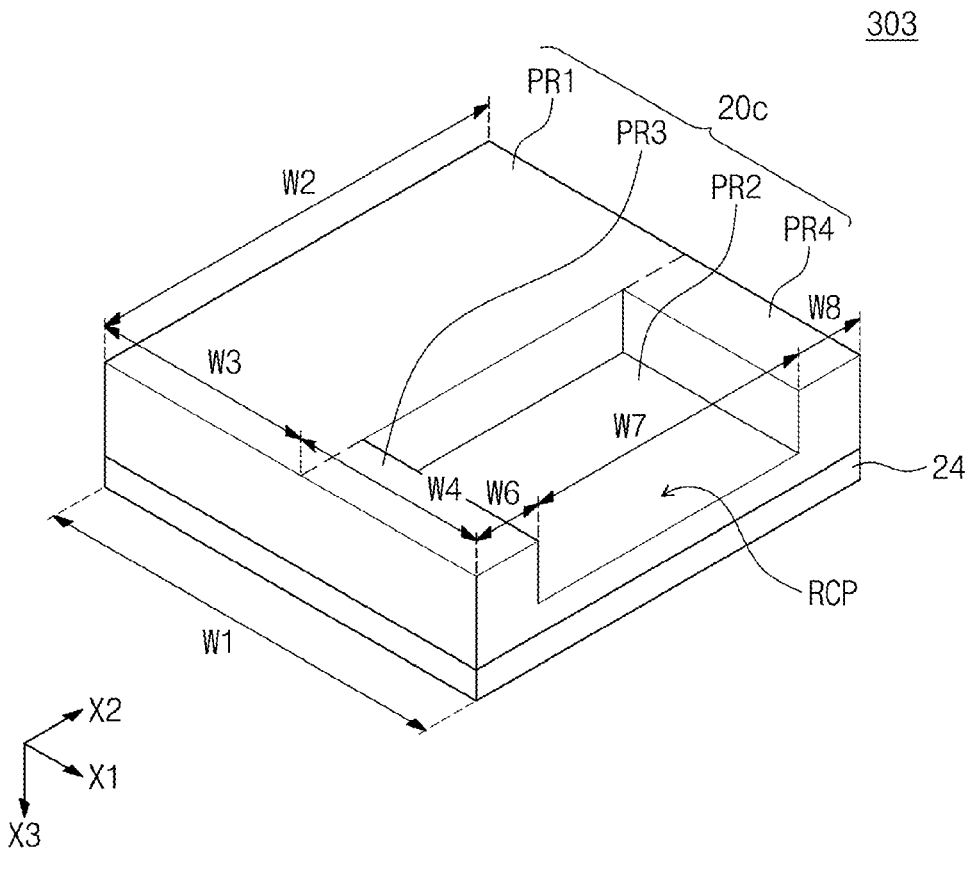
FIG. 16 is a perspective view of a second semiconductor chip in the semiconductor package of FIG. 15.

FIG. 16 is a perspective view illustrating the second semiconductor chip 303 in FIG. 15.

Referring to FIG. 16, the semiconductor substrate 20c of the second semiconductor chip 303 may include first to fourth substrate portions PR1 to PR4 which are provided as a single object, e.g., a seamless integrated substrate. Each of the first, third and fourth substrate portions PR1, PR3, and PR4 may have the third thickness T3 of FIG. 3, and the second substrate portion PR2 therebetween may have the fourth thickness T4 of FIG. 3. The third and fourth substrate portions PR3 and PR4 may be spaced apart from each other in the second direction X2 and may be in contact with the side surface of the first substrate portion PR1. The second substrate portion PR2 may be located between the third substrate portion PR3 and the fourth substrate portion PR4. The recessed region RCP may be formed on the second substrate portion PR2.

The first, third and fourth substrate portions PR1, PR3, and PR4 may be connected to each other and may be referred to as a 'protruding portion'. The protruding portions PR1, PR3, and PR4 may be shaped like the letter 'C', when viewed in a plan view. The protruding portions PR1, PR3, and PR4 of the second semiconductor chip 303 may be used to stably support the third to fifth semiconductor chips 310, 320, and 330 of FIG. 15. In the embodiment of FIG. 16, at least some of the third to eighth widths W3 to W8 may be equal to or different from each other. For example, the seventh width W7 of the recessed region RCP in the second direction X2 may be 50-80% of the second width W2 of the second semiconductor chip 302. The third substrate portion PR3 may have the sixth width W6 in the second direction X2. The fourth substrate portion PR4 may have the eighth width W8 in the second direction X2. The sixth width W6 may be equal to or different from the eighth width W8. The sixth and eighth widths W6 and W8 may be, each independently, 5-40% of the second width W2.

In the embodiment of FIG. 15, the through vias TSV in second semiconductor chip 303 may be provided to penetrate the protruding portions PR1, PR3, and PR4. Although not shown, in the embodiment of FIG. 16, the surface of the recessed region RCP may be covered with the protection layer PL of FIG. 6. Except for these differences, other portions of the semiconductor chip may be configured to have the same or similar features as the previous embodiments.

Figure 17A:
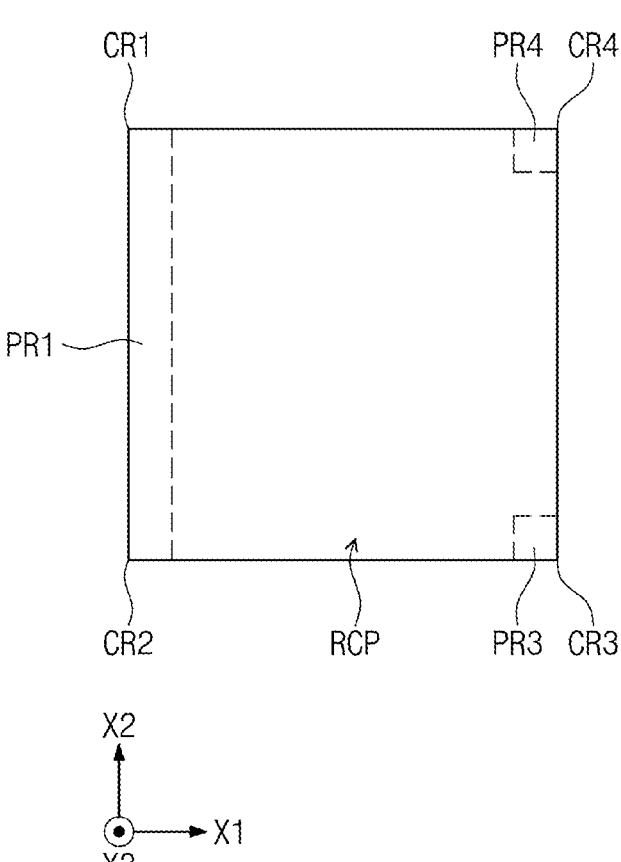
FIG. 17A is a plan view of a second semiconductor chip according to an embodiment.
Figure 17B:
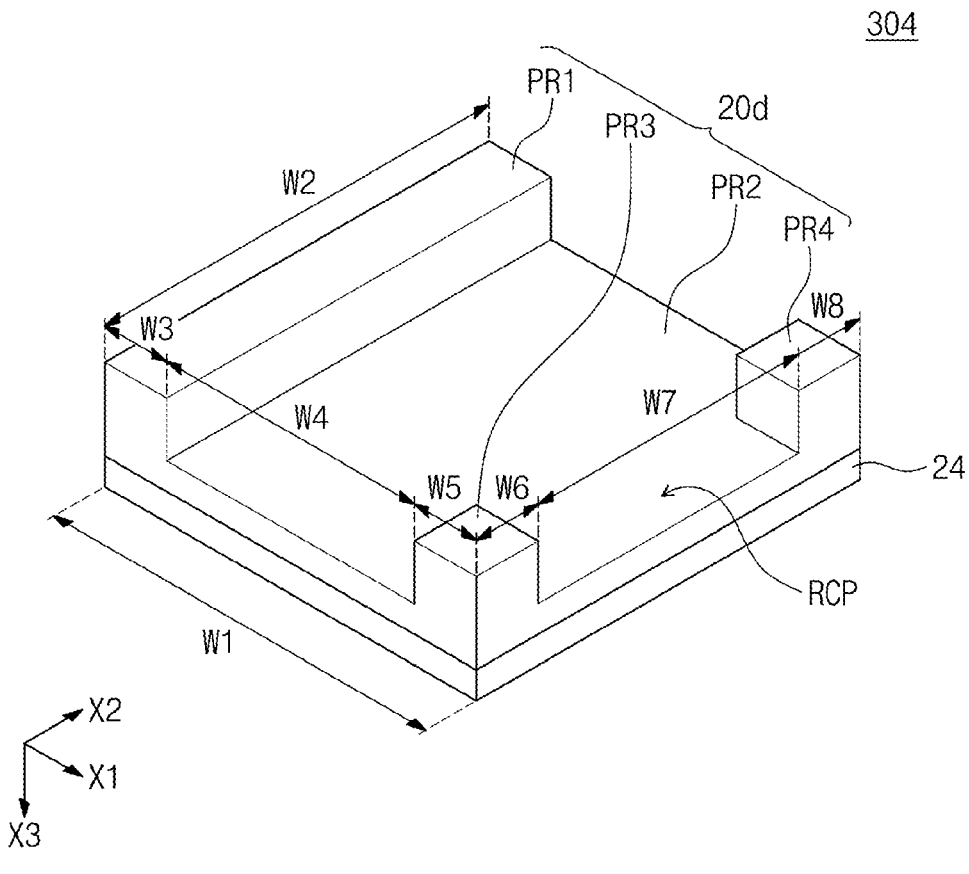
FIG. 17B is a perspective view of the second semiconductor chip of FIG. 17A.

FIG. 17A is a plan view illustrating a second semiconductor chip according to an embodiment. FIG. 17B is a perspective view illustrating the second semiconductor chip of FIG. 17A.

Referring to FIGS. 17A and 17B, a second semiconductor chip 304 according to the present embodiment may include a semiconductor substrate 20d with first to fourth substrate portions PR1 to PR4, and here, the first to fourth substrate portions PR1 to PR4 may be parts of the semiconductor substrate 20d and may be provided as a single object. Each of the first, third and fourth substrate portions PR1, PR3, and PR4 may have the third thickness T3 described with reference to FIG. 3, and the second substrate portion PR2 therebetween may have the fourth thickness T4 of FIG. 3. The first, third and fourth substrate portions PR1, PR3, and PR4 may be spaced apart from each other. Each of the first, third and fourth substrate portions PR1, PR3, and PR4 may be referred to as a 'protruding portion'. The first substrate portion PR1 may be a bar-shaped portion which extends in the second direction X2, when viewed in a plan view. The first substrate portion PR1 may have the third width W3 in the first direction X1 and may have the second width W2 in the second direction X2. Each of the third and fourth substrate portions PR3 and PR4 may have a square or rectangular shape, when viewed in a plan view. The third substrate portion PR3 may have the fifth width W5 in the first direction X1 and may have the sixth width W6 in the second direction X2. The fourth substrate portion PR4 may have the fifth width W5 in the first direction X1 and may have the eighth width W8 in the second direction X2. The second substrate portion PR2 may be located between the first, third and fourth substrate portions PR1, PR3, and PR4. The recessed region RCP may be formed on the second substrate portion PR2.

The second semiconductor chip 304 may include four corners CR1 to CR4 arranged in the counter-clockwise direction. The first, third and fourth substrate portions PR1, PR3, and PR4 may overlap the four corners CR1 to CR4. Accordingly, the first, third and fourth substrate portions PR1, PR3, and PR4 may stably support the third to fifth semiconductor chips 310, 320, and 330 of FIG. 15.

In the structure of FIG. 17B, some of the third to eighth widths W3 to W8 may be equal to or different from each other. For example, the fourth width W4 of the recessed region RCP in the first direction X1 may be 50-80% of the first width W1 of the second semiconductor chip 304. The seventh width W7 of the recessed region RCP in the second direction X2 may be 50-80% of the second width W2 of the second semiconductor chip 304. The third width W3 may be equal to or different from the fifth width W5. The third and fifth widths W3 and W5 may be, each independently, 5-40% of the first width W1. The sixth width W6 may be equal to or different from the eighth width W8. The sixth and eighth widths W6 and W8 may be, each independently, 5-40% of the second width W2.

The recessed region RCP may be exposed to the outside of the second semiconductor chip 304 near the side surfaces of the second semiconductor chip 304 in the first and second directions X1 and X2. The first semiconductor chip 200 may be inserted in the recessed region RCP. Accordingly, in the case where the second semiconductor chip 304 is replaced with the second semiconductor chip 300 of FIG. 2, the second semiconductor chip 302 of FIG. 11, or the second semiconductor chip 303 of FIG. 15, the mold layer MD may be easily inserted into the recessed region RCP.

Although not shown, in the embodiment of FIG. 17B, the surface of the recessed region RCP may be covered with the protection layer PL of FIG. 6. Except for the afore-described differences, the semiconductor chip according to the present embodiment may have substantially the same features as that described with reference to FIG. 16.

Figure 18:
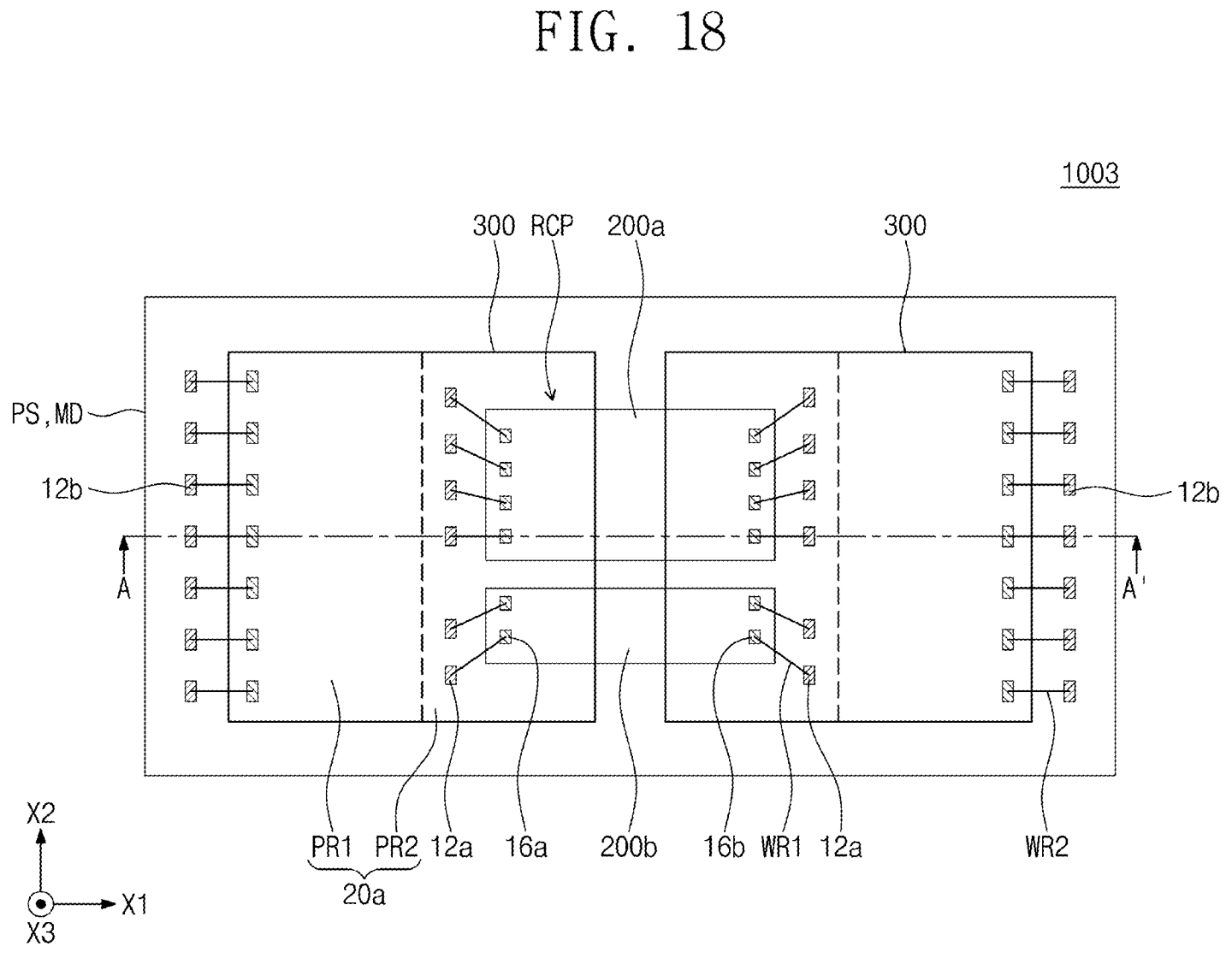

FIG. 18 is a plan view illustrating a semiconductor package according to an embodiment. The semiconductor package of FIG. 18 may have the same or similar cross-section as that in FIG. 2, when it is taken along line A-A'.

Referring to FIG. 18, in a semiconductor package 1003 according to the present embodiment, a pair of first semiconductor chips 200a and 200b may be inserted in the recessed regions RCP. The first semiconductor chips 200a and 200b may be spaced apart from each other in the second direction X2. Widths of the first semiconductor chips 200a and 200b in the second direction X2 may be equal to or different from each other. In the present embodiment, an example in which a pair of the first semiconductor chips are inserted in the recessed regions RCP is illustrated, but embodiments are not limited to this example. For example, three or more first semiconductor chips may be inserted in the recessed regions RCP. Except for the above features, the semiconductor package in the present embodiment may be substantially the same as or similar to those described with reference to FIGS. 1 to 6.

In a semiconductor package according to an embodiment, a second semiconductor chip may include a recessed region, in which a first semiconductor chip can be inserted. Accordingly, it may be possible to remarkably reduce at least one of horizontal and/or vertical sizes of the semiconductor package.

By way of summation and review, an embodiment provides a highly-integrated semiconductor package. That is, an embodiments provides a semiconductor package having a lowermost semiconductor chip inserted into a recessed region, e.g., a cavity, of a semiconductor chip thereabove, thereby reducing at least one of the horizontal and/or vertical sizes of the semiconductor package.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
a first set of semiconductor chips stacked on a package substrate and including a lowermost semiconductor chip and a plurality of semiconductor chips stacked on the lowermost semiconductor chip, the lowermost semiconductor chip of the first set of semiconductor chips including a first protruding portion protruding horizontally in a horizontal direction parallel to a top surface of the package substrate to overhang above the package substrate;
a second set of semiconductor chips stacked on the package substrate and including a lowermost semiconductor chip and a plurality of semiconductor chips stacked on the lowermost semiconductor chip, the lowermost semiconductor chip of the second set of semiconductor chips including a second protruding portion protruding horizontally in a direction parallel to the top surface of the package substrate to overhang the package substrate, such that the first protruding portion faces the second protruding portion with a gap therebetween; and
an additional semiconductor chip disposed below the first protruding portion and the second protruding portion to overlap each of the first protruding portion and the second protruding portion in a vertical direction perpendicular to the horizontal direction, the additional semiconductor chip being electrically connected to the package substrate,
wherein the additional semiconductor chip is disposed between the first protruding portion and the package substrate and between the second protruding portion and the package substrate.

2. The semiconductor package as claimed in claim 1, wherein the semiconductor chips of the first set of semiconductor chips have a same function and have a same top surface size as each other when viewed from a plan view.

3. The semiconductor package as claimed in claim 1, wherein each of the lowermost first semiconductor chip of the first set of semiconductor chips and the lowermost semiconductor chip of the second set of semiconductor chips includes:
a semiconductor substrate; and
a circuit layer on the semiconductor substrate,
wherein a recessed region below the protruding portion is disposed in the semiconductor substrate, and
wherein the additional semiconductor chip is disposed between the package substrate and the circuit layer of each lowermost semiconductor chip.

4. The semiconductor package as claimed in claim 3, wherein for each lowermost semiconductor chip, a recessed region is formed beneath the protruding portion, and a surface roughness of a surface of the recessed region is different from a surface roughness of a side surface of the semiconductor substrate.

5. The semiconductor package as claimed in claim 4, wherein the recessed region has a depth in a range from 90 μm to 780 μm, when measured from a lowermost surface of the semiconductor substrate.

6. The semiconductor package as claimed in claim 1, further comprising a mold layer covering the first set of semiconductor chips and the second set of semiconductor chips, the mold layer extending under the first protruding portion and under the second protruding portion, to cover the additional semiconductor chip.

7. The semiconductor package as claimed in claim 1, further comprising:
a first adhesive layer between the lowermost semiconductor chip of the first set of semiconductor chips and the package substrate, the first adhesive layer having a first thickness; and
second adhesive layers between adjacent ones of the semiconductor chips of the first set of semiconductor chips other than the lowermost semiconductor chip of the first set of semiconductor chips, at least one of the second adhesive layers having a second thickness different from the first thickness.

8. The semiconductor package as claimed in claim 7, further comprising a wire connecting one of the semiconductor chips of the first set of semiconductor chips to another of the semiconductor chips of the first set of semiconductor chips, the wire being buried in one of the second adhesive layers.

9. The semiconductor package as claimed in claim 1, wherein the first set of semiconductor chips is arranged in a mirror symmetric structure with respect to the second set of semiconductor chips, and two opposite end portions of the additional semiconductor chip overlap the two stacks, respectively.

10. The semiconductor package as claimed in claim 1, wherein a portion of the additional semiconductor chip is not covered by any of the semiconductor chips of the first set of semiconductor chips and is not covered by any of the semiconductor chips of the second set of semiconductor chips.

11. The semiconductor package as claimed in claim 1, wherein the first protruding portion overhangs a first wire formed therebelow and connecting the package substrate to the additional semiconductor chip, and the second protruding portion overhangs a second wire formed therebelow and connecting the package substrate to the additional semiconductor chip.

12. The semiconductor package as claimed in claim 1, wherein:
   the protruding portion of the lowermost chip of the first set of semiconductor chips includes a bottom surface overlapping and facing a first portion of a top surface of the additional semiconductor chip, and said bottom surface and top surface are electrically isolated from each other; and
   the protruding portion of the lowermost chip of the second set of semiconductor chips includes a bottom surface overlapping and facing a second portion of a top surface of the additional semiconductor chip, and said bottom surface and top surface are electrically isolated from each other.

13. A semiconductor package, comprising:
   a package substrate;
   a first semiconductor chip on a center region of the package substrate, the first semiconductor chip being electrically connected to the package substrate, and the first semiconductor chip having a first side surface and a second side surface, which are opposite to each other in a horizontal direction; and
   second to fifth semiconductor chips, each overlapping the first side surface of the first semiconductor chip, the second to fifth semiconductor chips being sequentially stacked on the first semiconductor chip in the vertical direction, and the second to fifth semiconductor chips being electrically connected to the package substrate,
   wherein the second semiconductor chip includes a first semiconductor substrate and a first circuit layer on the first semiconductor substrate,
   wherein the first semiconductor substrate includes a first recessed region, in which the first semiconductor chip is inserted, so that part of the first semiconductor chip is between the second semiconductor chip and the package substrate to be covered by the second semiconductor chip, and part of the first semiconductor chip is not covered by the second semiconductor chip, and
   the first recessed region has a depth in a range from 90 μm to 780 μm, when measured from a lowermost surface of the first semiconductor substrate.

16

14. The semiconductor package as claimed in claim 13, wherein the second to fifth semiconductor chips overlap a third side surface of the first semiconductor chip.

15. The semiconductor package as claimed in claim 13, further comprising sixth to ninth semiconductor chips, each overlapping the second side surface of the first semiconductor chip, the sixth to ninth semiconductor chips sequentially stacked on the first semiconductor chip, and are electrically connected to the package substrate,
   wherein the sixth semiconductor chip includes a second semiconductor substrate and a second circuit layer on the second semiconductor substrate,
   wherein the second semiconductor substrate includes a second recessed region, in which the first semiconductor chip is inserted, and
   wherein the second recessed region has a depth in a range from 90 μm to 780 μm, when measured from a lowermost surface of the second semiconductor substrate.

16. The semiconductor package as claimed in claim 15, wherein the sixth to ninth semiconductor chips and the second to fifth semiconductor chips are arranged in a mirror symmetric shape.

17. A semiconductor package, comprising:
   a package substrate;
   a first semiconductor chip on and electrically connected to the package substrate;
   a second semiconductor chip on the first semiconductor chip, the second semiconductor chip having a recessed region, in which the first semiconductor chip is inserted, so that the first semiconductor chip is between the package substrate and a protruding portion of the second semiconductor chip formed above the recessed region;
   a first wire connecting the second semiconductor chip to the package substrate;
   a third semiconductor chip on the second semiconductor chip;
   a second wire connecting the third semiconductor chip to the second semiconductor chip; and
   a first adhesive layer between the second semiconductor chip and the third semiconductor chip, an upper portion of the second wire being buried in the first adhesive layer.

18. The semiconductor package as claimed in claim 17, wherein the second semiconductor chip includes a semiconductor substrate and a circuit layer on the semiconductor substrate, the recessed region being in the semiconductor substrate.

19. The semiconductor package as claimed in claim 18, wherein a surface roughness of a surface of the recessed region is different from a surface roughness of a side surface of the semiconductor substrate.

20. The semiconductor package as claimed in claim 17, further comprising a second adhesive layer between the first semiconductor chip and the package substrate, the second adhesive layer having a second thickness smaller than a first thickness of the first adhesive layer.

* * * * *